United States Patent
Shim et al.

(10) Patent No.: US 9,501,041 B2
(45) Date of Patent: Nov. 22, 2016

(54) DUTY CYCLE ERROR DETECTION DEVICE AND DUTY CYCLE CORRECTION DEVICE HAVING THE SAME

(71) Applicant: Samsung Electronics Co., Ltd., Suwon-si, Gyeonggi-do (KR)

(72) Inventors: Yong Shim, Suwon-si (KR); Won-Joo Yun, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/699,290

(22) Filed: Apr. 29, 2015

(65) Prior Publication Data

US 2016/0105165 A1  Apr. 14, 2016

(30) Foreign Application Priority Data

Oct. 10, 2014  (KR) .................. 10-2014-0136437

(51) Int. Cl.
| | |
|---|---|
| *H03K 3/017* | (2006.01) |
| *G04F 10/00* | (2006.01) |
| *H03K 5/156* | (2006.01) |
| *H03K 5/135* | (2006.01) |

(52) U.S. Cl.
CPC .......... *G04F 10/005* (2013.01); *H03K 5/1565* (2013.01); *H03K 5/135* (2013.01)

(58) Field of Classification Search
CPC . H03L 2207/50; H03L 7/0991; H03L 7/085; H03L 7/091
See application file for complete search history.

(56) References Cited

U.S. PATENT DOCUMENTS

| | | | |
|---|---|---|---|
| 6,956,418 B2 | 10/2005 | Kwak et al. | |
| 7,057,431 B2 | 6/2006 | Kwak | |
| 7,142,027 B2 * | 11/2006 | Lee ..................... | H03L 7/00 327/149 |
| 7,221,724 B2 | 5/2007 | Schell | |
| 7,227,920 B2 | 6/2007 | Heikkila | |
| 7,576,581 B2 | 8/2009 | Shin et al. | |
| 7,915,939 B2 | 3/2011 | Jang et al. | |
| 8,143,928 B2 | 3/2012 | Satoh et al. | |

FOREIGN PATENT DOCUMENTS

| | | |
|---|---|---|
| KR | 20070046341 A | 5/2007 |
| KR | 100756136 B1 | 9/2007 |
| KR | 100879593 B1 | 1/2009 |

* cited by examiner

*Primary Examiner* — Sibin Chen
(74) *Attorney, Agent, or Firm* — Harness, Dickey & Pierce, P.L.C.

(57) ABSTRACT

In a duty cycle error detection device, a first digital code generator is configured to generate high and low codes corresponding to a lengths of high level low level periods, respectively, of a clock signal, generate a sign signal representing the longer period between the high level period and the low level period, and output one of the high and low digital codes corresponding to the shorter period as a first digital code. A clock delay circuit is configured to generate a delay clock signal by delaying the clock signal for a time corresponding to the first digital code, and a second digital code generator is configured to generate a duty error digital code corresponding to a length from a start of the longer period of the delay clock signal to an end of the longer period of the clock signal based on the sign signal.

9 Claims, 24 Drawing Sheets

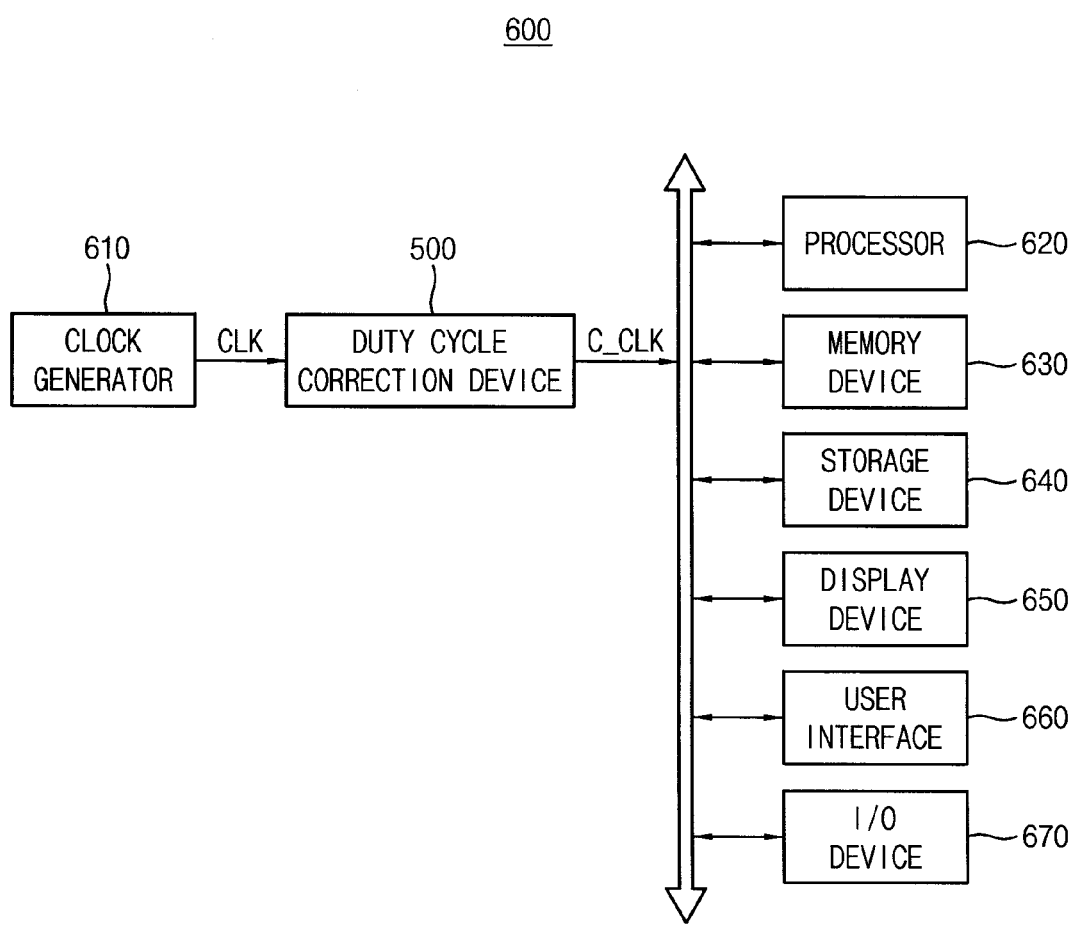

DUTY CYCLE ERROR DETECTION DEVICE AND DUTY CYCLE CORRECTION DEVICE HAVING THE SAME

CROSS-REFERENCE TO RELATED APPLICATION(S)

This application claims priority under 35 USC §119 to Korean Patent Application No. 10-2014-0136437, filed on Oct. 10, 2014 in the Korean Intellectual Property Office (KIPO), the contents of which are herein incorporated by reference in their entirety.

BACKGROUND

1. Technical Field

Some example embodiments relate to a technique for correcting a duty cycle of a clock signal, and more particularly to a duty cycle error detection device and/or a duty cycle correction device including the duty cycle error detection device.

2. Description of the Related Art

Generally, an electronic device operates in synchronization with a clock signal.

For example, a conventional electronic device may operate in synchronization with a rising edge of a clock signal. Recently, as an operation speed of an electronic device increases, an electronic device, which operates in synchronization with both a rising edge and a falling edge of a clock signal, has been widely in use.

In an electronic device operating in synchronization with both a rising edge and a falling edge of a clock signal, if the clock signal includes a duty cycle error such that a length of a high level period of the clock signal and a length of a low level period of the clock signal are different from each other, the electronic device may operate incorrectly.

SUMMARY

Some example embodiments are directed to provide a duty cycle error detection device that effectively detects a duty cycle error of a clock signal.

Some example embodiments are directed to provide a duty cycle correction device including the duty cycle error detection device.

Some example embodiments are directed to provide an electronic device including the duty cycle correction device.

According to an example embodiment, a duty cycle error detection device includes a first digital code generator, a clock delay circuit and a second digital code generator. The first digital code generator generates a high digital code and a low digital code, which correspond to a length of a high level period of a clock signal and a length of a low level period of the clock signal, respectively, determines a longer period and a shorter period between the high level period of the clock signal and the low level period of the clock signal based on the high digital code and the low digital code, generates a sign signal representing the longer period of the clock signal, and outputs one of the high digital code and the low digital code, which corresponds to the shorter period of the clock signal, as a first digital code. The clock delay circuit generates a delay clock signal by delaying the clock signal for a time corresponding to the first digital code. The second digital code generator generates a duty error digital code, which corresponds to a length from a start of the longer period of the delay clock signal to an end of the longer period of the clock signal, based on a logic level of the sign signal.

In an example embodiment, the first digital code generator is configured to generate the high digital code and the low digital code by performing a time-to-digital conversion on the length of the high level period of the clock signal and the length of the low level period of the clock signal, respectively, based on a first unit delay, and the second digital code generator is configured to generate the duty error digital code by performing the time-to-digital conversion on the length from the start of the longer period of the delay clock signal to the end of the longer period of the clock signal based on a second unit delay, which is smaller than the first unit delay.

The clock delay circuit is configured to generate the delay clock signal by delaying the clock signal for a delay time generated by performing a digital-to-time conversion on the first digital code based on the first unit delay.

The first digital code generator may include a first pulse generator configured to generate a first pulse signal having a length corresponding to the length of the high level period of the clock signal, a second pulse generator configured to generate a second pulse signal having a length corresponding to the length of the low level period of the clock signal, a first coarse time-to-digital converter configured to generate the high digital code by performing the time-to-digital conversion on the length of the first pulse signal based on the first unit delay, a second coarse time-to-digital converter configured to generate the low digital code by performing the time-to-digital conversion on the length of the second pulse signal based on the first unit delay, and a coarse controller configured to determine the longer period and the shorter period between the high level period of the clock signal and the low level period of the clock signal based on the high digital code and the low digital code, to output the sign signal having a logic level corresponding to the longer period of the clock signal, and to output one of the high digital code and the low digital code, which corresponds to the shorter period of the clock signal, as the first digital code.

The first coarse time-to-digital converter may include first through n-th delay circuits coupled in series, each of the first through n-th delay circuits being configured to generate an output signal by delaying an input signal for the first unit delay, and first through n-th flip-flops configured to latch the first pulse signal in synchronization with a rising edge of the output signal of the first through n-th delay circuits, respectively, and to output the latched signals as first through n-th bit data, respectively. The input signal of the first delay circuit may correspond to the first pulse signal, and the output signal of the k-th delay circuit may be provided as the input signal of the (k+1)-th delay circuit, where k is a positive integer equal to or smaller than (n−1). The high digital code may include the first through n-th bit data.

The second coarse time-to-digital converter may include first through n-th delay circuits coupled in series, each of the first through n-th delay circuits being configured to generate an output signal by delaying an input signal for the first unit delay, and first through n-th flip-flops configured to latch the second pulse signal in synchronization with a rising edge of the output signal of the first through n-th delay circuits, respectively, and to output the latched signals as first through n-th bit data, respectively. The input signal of the first delay circuit may correspond to the second pulse signal, and the output signal of the k-th delay circuit may be provided as the input signal of the (k+1)-th delay circuit, where k is a positive integer equal to or smaller than (n−1). The low digital code may include the first through n-th bit data.

The first digital code generator may include a pulse generator configured to generate a pulse signal having a length corresponding to the length of the high level period of the clock signal when a selection signal has a first logic level, and to generate a pulse signal having a length corresponding to the length of the low level period of the clock signal when the selection signal has a second logic level, a coarse time-to-digital converter configured to generate a digital code by performing the time-to-digital conversion on the length of the pulse signal based on the first unit delay, and a coarse controller configured to receive the digital code from the coarse time-to-digital converter as the high digital code while outputting the selection signal having the first logic level, and to receive the digital code from the coarse time-to-digital converter as the low digital code while outputting the selection signal having the second logic level, the coarse controller being configured to determine the longer period and the shorter period between the high level period of the clock signal and the low level period of the clock signal based on the high digital code and the low digital code, to output the sign signal having a logic level corresponding to the longer period of the clock signal, and to output one of the high digital code and the low digital code, which corresponds to the shorter period of the clock signal, as the first digital code.

The clock delay circuit may include first through n-th delay circuits coupled in series, each of the first through n-th delay circuits being configured to generate an output clock signal by delaying an input clock signal for the first unit delay, and a delay controller configured to output one of the output clock signals received from the first through n-th delay circuits as the delay clock signal based on the first digital code. The input clock signal of the first delay circuit may correspond to the clock signal, and the output clock signal of the k-th delay circuit may be provided as the input clock signal of the (k+1)-th delay circuit, where k is a positive integer equal to or smaller than (n−1).

The second digital code generator may include a pulse generator configured to generate a pulse signal having a length corresponding to the length from the start of the longer period of the delay clock signal to the end of the longer period of the clock signal based on the logic level of the sign signal, first through m-th delay circuits coupled in series, each of the first through m-th delay circuits being configured to generate an output signal by delaying an input signal for the second unit delay, and first through m-th flip-flops configured to latch the pulse signal in synchronization with a rising edge of the output signal of the first through m-th delay circuits, respectively, and to output the latched signals as first through m-th bit data, respectively. The input signal of the first delay circuit may correspond to the pulse signal, and the output signal of the s-th delay circuit may be provided as the input signal of the (s+1)-th delay circuit, where s is a positive integer equal to or smaller than (m−1). The duty error digital code may include the first through m-th bit data.

According to an example embodiment, a duty cycle correction device includes a duty cycle error detection device, a phase align circuit and a clock synthesis circuit. The duty cycle error detection device generates a sign signal, which represents a longer period between a high level period of a clock signal and a low level period of the clock signal, and a duty error digital code, which corresponds to a difference between a length of the high level period of the clock signal and a length of the low level period of the clock signal. The phase align circuit outputs one of the clock signal and an inverted clock signal, which corresponds to an inverted version of the clock signal, as a first internal clock signal based on a logic level of the sign signal, and generates a second internal clock signal by delaying the other one of the clock signal and the inverted clock signal for a time corresponding to a half of the duty error digital code. The clock synthesis circuit generates a corrected clock signal, which toggles at each rising edge of the first internal clock signal and each rising edge of the second internal clock signal.

In an example embodiment, the duty cycle error detection device may include a first digital code generator configured to generate a high digital code and a low digital code, which correspond to the length of the high level period of the clock signal and the length of the low level period of the clock signal, respectively, to determine a longer period and a shorter period between the high level period of the clock signal and the low level period of the clock signal based on the high digital code and the low digital code, to generate the sign signal representing the longer period of the clock signal, and to output one of the high digital code and the low digital code, which corresponds to the shorter period of the clock signal, as a first digital code, a clock delay circuit configured to generate a delay clock signal by delaying the clock signal for a time corresponding to the first digital code, and a second digital code generator configured to generate the duty error digital code, which corresponds to a length from a start of the longer period of the delay clock signal to an end of the longer period of the clock signal, based on the logic level of the sign signal.

The first digital code generator is configured to generate the high digital code and the low digital code by performing a time-to-digital conversion on the length of the high level period of the clock signal and the length of the low level period of the clock signal, respectively, based on a first unit delay, and the second digital code generator is configured to generate the duty error digital code by performing the time-to-digital conversion on the length from the start of the longer period of the delay clock signal to the end of the longer period of the clock signal based on a second unit delay, which is smaller than the first unit delay.

The clock delay circuit is configured to generate the delay clock signal by delaying the clock signal for a first delay time generated by performing a digital-to-time conversion on the first digital code based on the first unit delay, and the phase align circuit is configured to generate the second internal clock signal by delaying the other one of the clock signal and the inverted clock signal for a second delay time generated by performing the digital-to-time conversion on the half of the duty error digital code based on the second unit delay.

The duty cycle correction device may further comprise a multiplexer configured to output one of the clock signal and the corrected clock signal as an output clock signal in response to a bypass signal. The first digital code generator is configured to activate the bypass signal when the high digital code is identical to the low digital code.

The duty cycle correction device may further comprise an OR gate configured to perform an OR operation on a first control signal and a second control signal to generate a bypass signal, and a multiplexer configured to output one of the clock signal and the corrected clock signal as an output clock signal in response to the bypass signal. The first digital code generator is configured to activate the first control signal when the high digital code is identical to the low digital code, and the second digital code generator is configured to activate the second control signal when the duty error digital code is smaller than a threshold code.

In an example embodiment, the phase align circuit may include a phase splitter configured to receive the clock signal, and to output the clock signal and the inverted clock signal in synchronization with each other, a first path selector configured, based on the logic level of the sign signal, to output one of the clock signal and the inverted clock signal as the first internal clock signal and to output the other one of the clock signal and the inverted clock signal as a third internal clock signal, a clock delay circuit configured to generate the second internal clock signal by delaying the third internal clock signal for a time corresponding to a half of the duty error digital code, and a second path selector configured, based on the logic level of the sign signal, to output one of the first internal clock signal and the second internal clock signal through a first output electrode and to output the other one of the first internal clock signal and the second internal clock signal through a second output electrode.

The first path selector is configured to output the inverted clock signal as the first internal clock signal and output the clock signal as the third internal clock signal when the sign signal represents that the high level period of the clock signal is longer than the low level period of the clock signal. The first path selector may output the clock signal as the first internal clock signal and output the inverted clock signal as the third internal clock signal when the sign signal represents that the low level period of the clock signal is longer than the high level period of the clock signal.

In an example embodiment, the clock synthesis circuit may include a multiplexer configured to output one of the first internal clock signal and the second internal clock signal as a control clock signal in response to a clock selection signal, and a flip-flop configured to latch the clock selection signal in synchronization with a rising edge of the control clock signal, to output the latched signal as the corrected clock signal, and to output an inverted version of the corrected clock signal as the clock selection signal.

In an example embodiment, the clock synthesis circuit may include a first frequency divider configured to generate a first divided clock signal, which toggles at each rising edge of one of the first internal clock signal and the second internal clock signal, a second frequency divider configured to generate a second divided clock signal, which toggles at each rising edge of the other one of the first internal clock signal and the second internal clock signal, and an exclusive OR gate configured to perform an exclusive OR (XOR) operation on the first divided clock signal and the second divided clock signal to generate the corrected clock signal.

According to an example embodiment, an electronic device includes a clock generator, a duty cycle correction device, a memory device and a processor. The clock generator generates a clock signal. The duty cycle correction device corrects a duty cycle error of the clock signal to generate a corrected clock signal. The memory device operates in synchronization with the corrected clock signal. The processor writes data in the memory device and reads the data from the memory device. The duty cycle correction device includes a duty cycle error detection device configured to generate a sign signal, which represents a longer period between a high level period of the clock signal and a low level period of the clock signal, and a duty error digital code, which corresponds to a difference between a length of the high level period of the clock signal and a length of the low level period of the clock signal, a phase align circuit configured to output one of the clock signal and an inverted clock signal, which corresponds to an inverted version of the clock signal, as a first internal clock signal based on a logic level of the sign signal, and to generate a second internal clock signal by delaying the other one of the clock signal and the inverted clock signal for a time corresponding to a half of the duty error digital code, and a clock synthesis circuit configured to generate a corrected clock signal, which toggles at each rising edge of the first internal clock signal and each rising edge of the second internal clock signal.

BRIEF DESCRIPTION OF THE DRAWINGS

Illustrative, non-limiting example embodiments will be more clearly understood from the following detailed description in conjunction with the accompanying drawings.

FIG. 30 is a block diagram illustrating an electronic device according to some example embodiments.

DETAILED DESCRIPTION OF THE EMBODIMENTS

Figure 1:
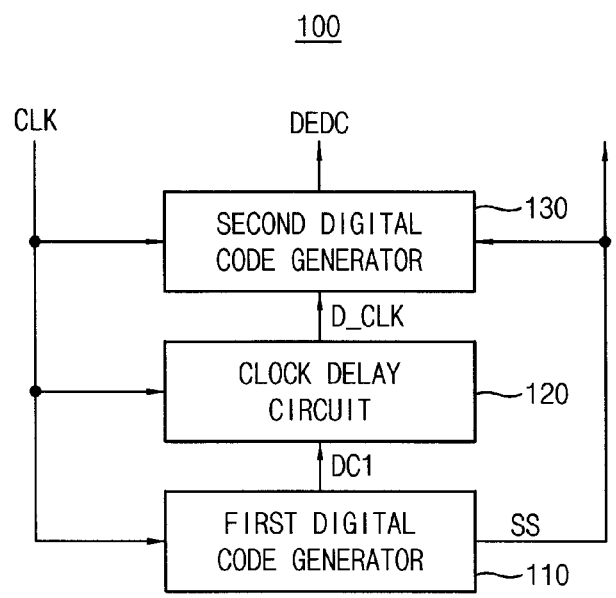
FIG. 1 is a block diagram illustrating a duty cycle error detection device according to some example embodiments.

Various example embodiments will be described more fully with reference to the accompanying drawings, in which some example embodiments are shown. The present inventive concepts may, however, be embodied in many different forms and should not be construed as limited to the embodiments set forth herein. Rather, these embodiments are provided so that this disclosure will be thorough and complete, and will fully convey the scope of the present inventive concepts to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a duty cycle error detection device according to some example embodiments.

Referring to FIG. 1, a duty cycle error detection device 100 includes a first digital code generator 110, a clock delay circuit 120 and a second digital code generator 130.

The first digital code generator 110 receives a clock signal CLK, and generates a high digital code and a low digital code, which correspond to a length of a high level period of the clock signal CLK and a length of a low level period of the clock signal CLK, respectively.

In some example embodiments, the first digital code generator 110 may generate the high digital code by performing a time-to-digital conversion on the length of the high level period of the clock signal CLK based on a first unit delay, and generate the low digital code by performing the time-to-digital conversion on the length of the low level period of the clock signal CLK based on the first unit delay.

The first digital code generator 110 determines a longer period and a shorter period between the high level period of the clock signal CLK and the low level period of the clock signal CLK based on the high digital code and the low digital code, and generate a sign signal SS representing the longer period of the clock signal CLK. For example, the first digital code generator 110 may generate the sign signal SS having a first logic level when the high level period of the clock signal CLK is longer than the low level period of the clock signal CLK, and generate the sign signal SS having a second logic level when the low level period of the clock signal CLK is longer than the high level period of the clock signal CLK. In some example embodiments, the first logic level may be a logic high level, and the second logic level may be a logic low level. In other example embodiments, the first logic level may be a logic low level, and the second logic level may be a logic high level.

In addition, the first digital code generator 110 outputs one of the high digital code and the low digital code, which corresponds to the shorter period of the clock signal CLK, as a first digital code DC1.

The clock delay circuit 120 generates a delay clock signal D_CLK by delaying the clock signal CLK for a time corresponding to the first digital code DC1 received from the first digital code generator 110.

In some example embodiments, the clock delay circuit 120 may generate the delay clock signal D_CLK by delaying the clock signal CLK for a delay time generated by performing a digital-to-time conversion on the first digital code DC1 based on the first unit delay.

The second digital code generator 130 determines which one is longer between the high level period of the clock signal CLK and the low level period of the clock signal CLK based on a logic level of the sign signal SS received from the first digital code generator 110. The second digital code generator 130 generates a duty error digital code DEDC, which corresponds to a length from a start of the longer period of the delay clock signal D_CLK to an end of the longer period of the clock signal CLK.

In some example embodiments, the second digital code generator 130 may generate the duty error digital code DEDC by performing the time-to-digital conversion on the length from the start of the longer period of the delay clock signal D_CLK to the end of the longer period of the clock signal CLK based on a second unit delay, which is smaller than the first unit delay.

Figure 2:
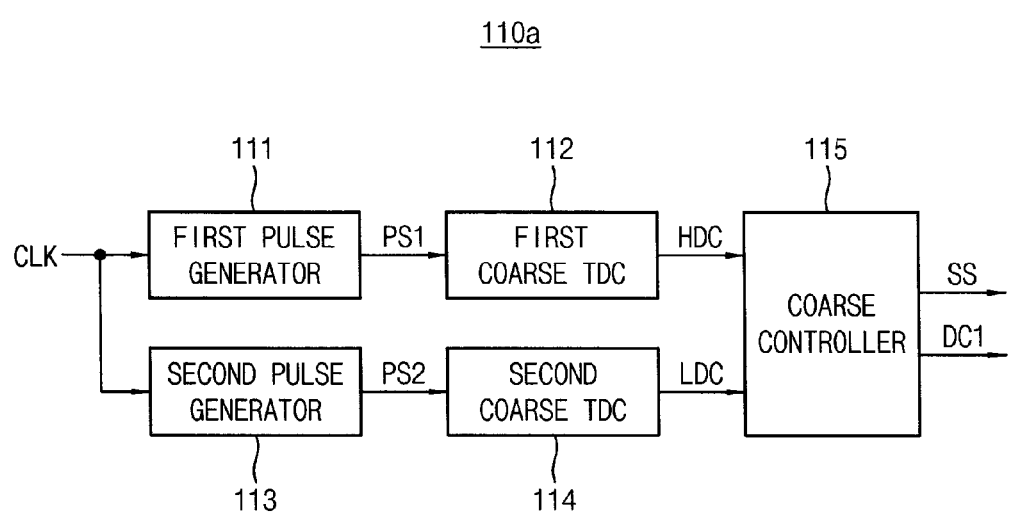
FIG. 2 is a block diagram illustrating an example of a first digital code generator included in the duty cycle error detection device of FIG. 1.

FIG. 2 is a block diagram illustrating an example of a first digital code generator included in the duty cycle error detection device of FIG. 1.

Referring to FIG. 2, a first digital code generator 110a may include a first pulse generator 111, a first coarse time-to-digital converter TDC 112, a second pulse generator 113, a second coarse time-to-digital converter TDC 114 and a coarse controller 115.

The first pulse generator 111 may receive the clock signal CLK, and generate a first pulse signal PS1 having a length corresponding to the length of the high level period of the clock signal CLK.

The first coarse time-to-digital converter 112 may generate the high digital code HDC by performing the time-to-digital conversion on the length of the first pulse signal PS1 based on the first unit delay.

Figure 3:
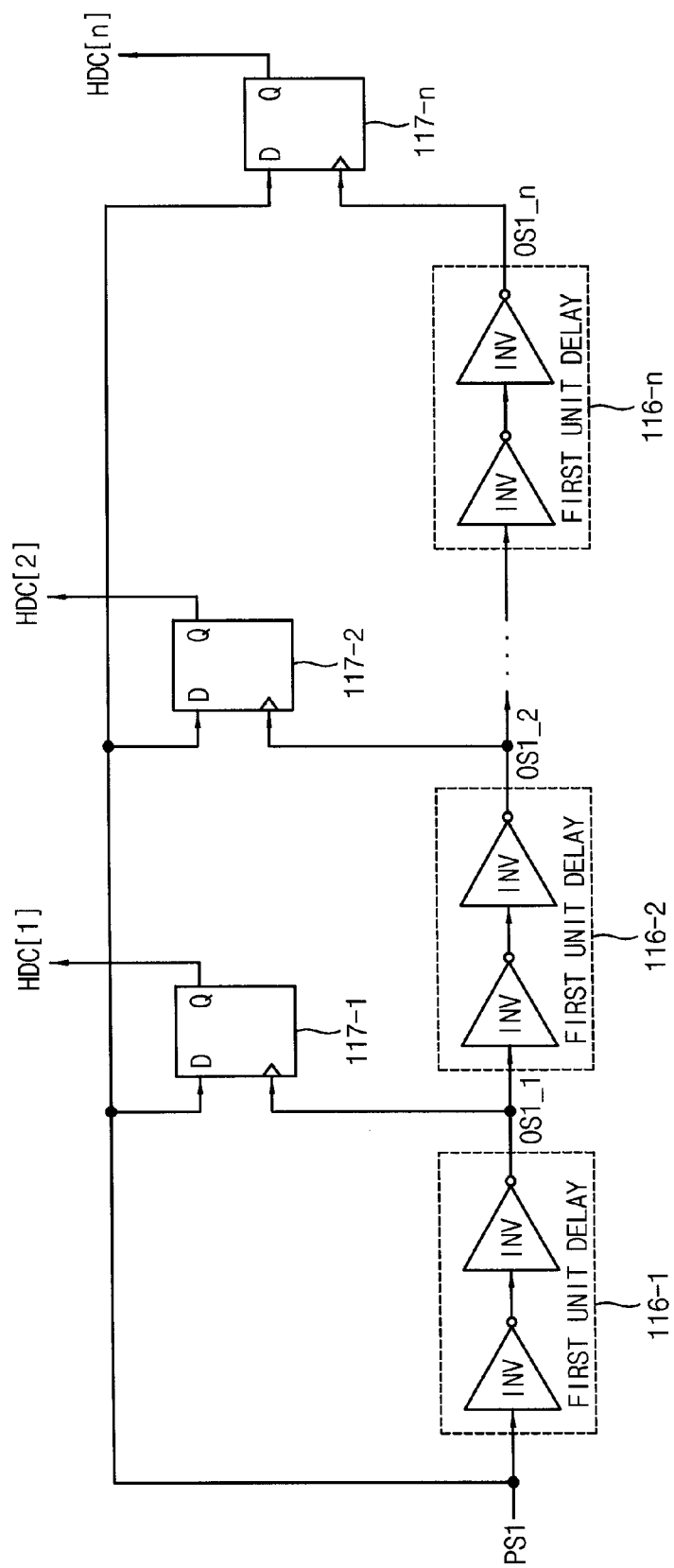
FIG. 3 is a block diagram illustrating an example of a first coarse time-to-digital converter included in the first digital code generator of FIG. 2.

FIG. 3 is a block diagram illustrating an example of a first coarse time-to-digital converter included in the first digital code generator of FIG. 2.

Referring to FIG. 3, the first coarse time-to-digital converter 112 may include first through n-th delay circuits 116-1, 116-2, generator of FIG. 2. lock signal CLK.r than the first 2, converter 112 may include first through n-th delay circuits 116-1, 116-

The first through n-th delay circuits 116-1, 116-2, e 116-n may be coupled in series. For example, an output signal of the k-th delay circuit 116-k may be provided as an input signal of the (k+1)-th delay circuit 116-(k+1). Here, k represents a positive integer equal to or smaller than (n−1). The first pulse signal PS1 generated by the first pulse generator 111 may be provided as an input signal of the first delay circuit 116-1.

Each of the first through n-th delay circuits 116-1, 116-2, ch 116-n may generate the output signal by delaying the input signal for the first unit delay. The output signals of the first through n-th delay circuits 116-1, 116-2, delay circuit 116-1.). The first pulse signal PS1 generated by the Here, k represents a positive the fi.

In some example embodiments, as illustrated in FIG. 3, each of the first through n-th delay circuits 116-1, 116-2, ch 116-n may include even numbers of inverters.

The first through n-th flip-flops 117-1, 117-2, ..., 117-n may latch the first pulse signal PS1 in synchronization with a rising edge of the first through n-th output signals OS1_1, OS1_2, n-th out, respectively, and output the latched signals as first through n-th bit data HDC[1], HDC[2], and output, respectively.

The high digital code HDC output by the first coarse time-to-digital converter 112 may include the first through n-th bit data HDC[1], HDC[2], 2], code HDC output by the first bit data HDC[1], which is output by the first flip-flop 117-1, may correspond to a first bit of the high digital code HDC, the second bit data HDC[2], which is output by the second flip-flop 117-2, may correspond to a second bit of the high digital code HDC, and the n-th bit data HDC[n], which is output by the n-th flip-flop 117-n, may correspond to an n-th bit of the high digital code HDC.

Figure 4:
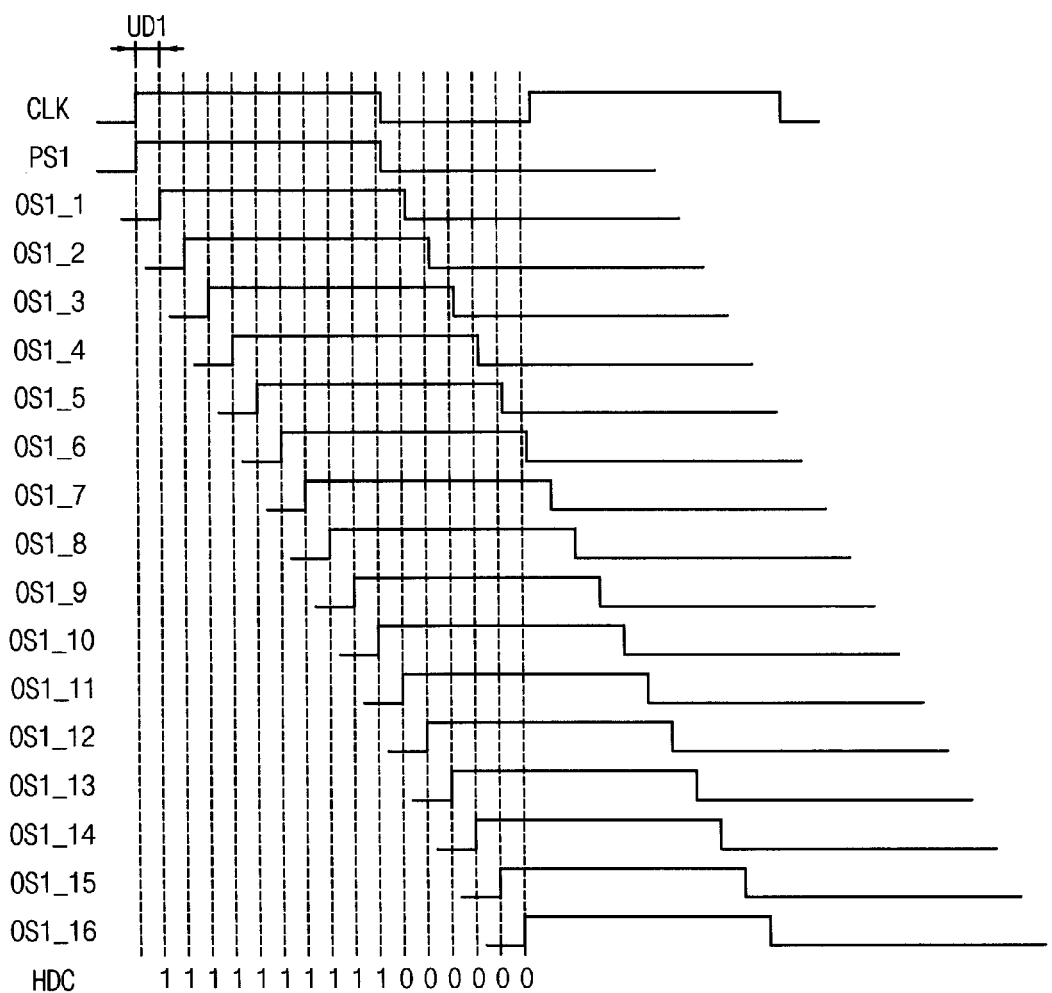
FIG. 4 is a diagram for describing an operation of the first coarse time-to-digital converter of FIG. 3.

FIG. 4 is a diagram for describing an operation of the first coarse time-to-digital converter of FIG. 3.

In FIG. 4, an operation of the first coarse time-to-digital converter 112 in the case that n is 16 is illustrated as an example.

As illustrated in FIG. 4, since the first pulse signal PS1, which has a length corresponding to the length of the high level period of the clock signal CLK, is provided as the input signal of the first delay circuit 116-1, the first through n-th delay circuits 116-1, 116-2, ..., 116-n may generate the first through n-th output signals OS1_1, OS1_2, ..., OS1_n, respectively, by consecutively delaying the first pulse signal PS1 for the first unit delay UD1.

As described above, the first through n-th flip-flops 117-1, 117-2, s a length corresponding to the length of the high level period of the clock signal CLK, is provided as the input signal of the first delay circuit 116-1, the ly, and output the latched signals as first through n-th bit data HDC[1], HDC[2], ..., HDC[n], respectively.

Therefore, referring to FIG. 4, since the first pulse signal PS1 is in a logic high level at a rising edge of each of the first through tenth output signals OS1_1, OS1_2, clock signal the first through tenth bit data HDC[1], HDC[2], 2], h tenth bit data HDC[1], HDC[2], gh level at a rising edge of each of the first through tenth output signals OS1_1, OS1_2, ..., OS1_10, e of the first through n-th output signals OS1_1, OS1_2, ..., OS1_n, reevel at a rising edge of each of the eleventh through sixteenth output signals OS1_11, OS1_12, S1_C[2],6, the eleventh through sixteenth bit data HDC[11], HDC[12], DC[ta HD6], which are output by the eleventh through sixteenth flip-flops 117-11, 117-12, 17 117-16, respectively, may have a logic low level.

Therefore, the first coarse time-to-digital converter 112 may output "herefore, the first the high digital code HDC. As such, the number of e time-to-digital converter 112 may output edge of each of theo the length of the first pulse signal PS1.

Although a structure and an operation of the first coarse time-to-digital converter 112 are described above with reference to FIGS. 3 and 4, example embodiments are not limited thereto. The first coarse time-to-digital converter 112 may be implemented with any structures that are able to convert the length of the first pulse signal PS1 into a digital value.

Referring again to FIG. 2, the second pulse generator 113 may receive the clock signal CLK, and generate a second pulse signal PS2 having a length corresponding to the length of the low level period of the clock signal CLK.

The second coarse time-to-digital converter 114 may generate the low digital code LDC by performing the time-to-digital conversion on the length of the second pulse signal PS2 based on the first unit delay UD1.

Figure 5:
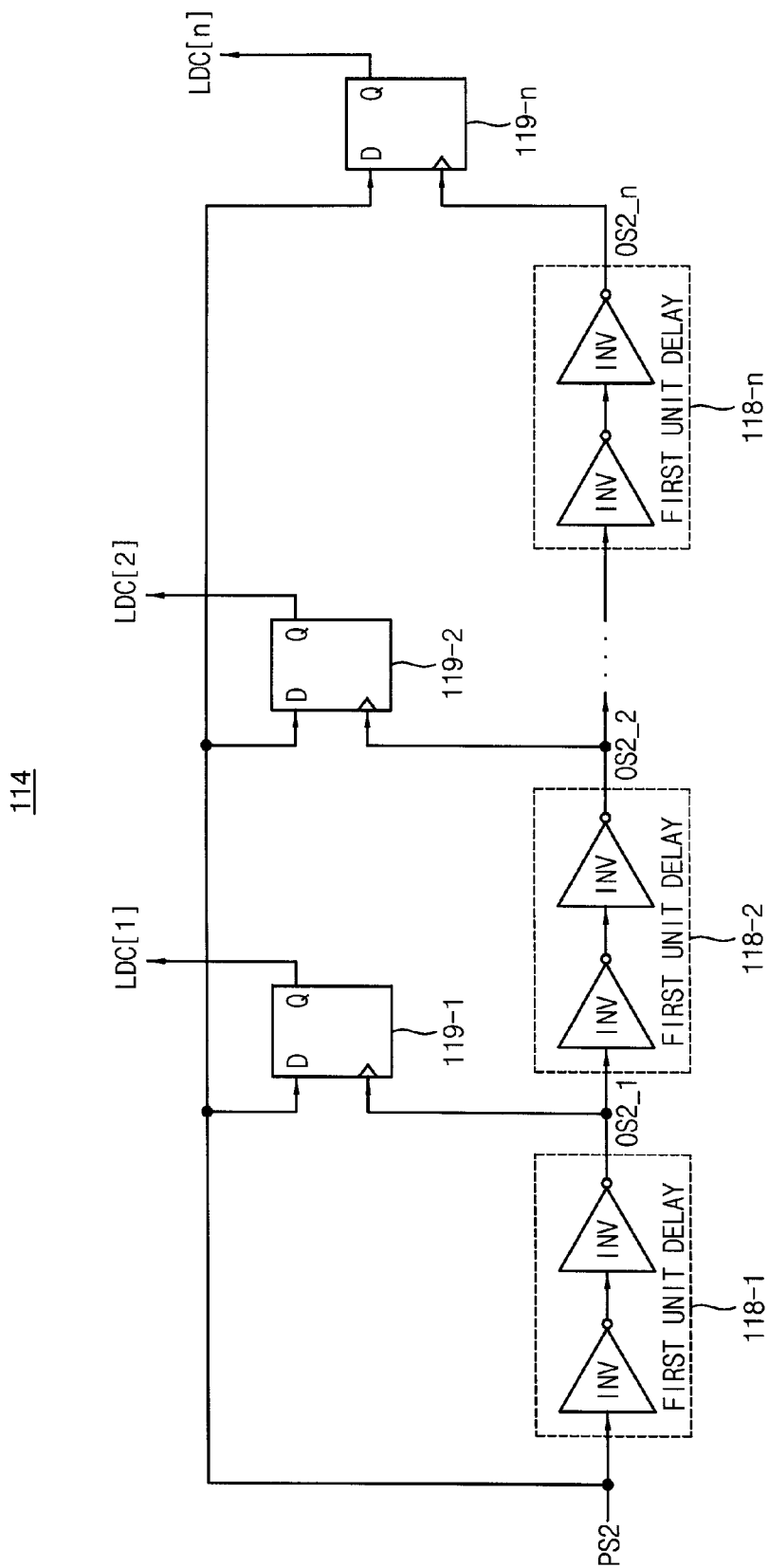
FIG. 5 is a block diagram illustrating an example of a second coarse time-to-digital converter included in the first digital code generator of FIG. 2.

FIG. 5 is a block diagram illustrating an example of a second coarse time-to-digital converter included in the first digital code generator of FIG. 2.

Referring to FIG. 5, the second coarse time-to-digital converter 114 may include first through n-th delay circuits 118-1, 118-2, 11nc18-n and first through n-th flip-flops 119-1, 119-2, 11 fi9-n.

The first through n-th delay circuits 118-1, 118-2, 118-n may be coupled in series. For example, an output signal of the k-th delay circuit 118-k may be provided as an input signal of the (k+1)-th delay circuit 118-(k+1). The second pulse signal PS2 generated by the second pulse generator 113 may be provided as an input signal of the first delay circuit 118-1.

Each of the first through n-th delay circuits 118-1, 118-2, 118-n may generate the output signal by delaying the input signal for the first unit delay UD1. The output signals of the first through n-th delay circuits 118-1, 118-2, 11 ou8-n may be referred to as first through n-th output signals OS2_1, OS2_2, OS be2_n, respectively.

In some example embodiments, as illustrated in FIG. 5, each of the first through n-th delay circuits 118-1, 118-2, 118-n may include even numbers of inverters.

The first through n-th flip-flops 119-1, 119-2, 11rst9-n may latch the second pulse signal PS2 in synchronization with a rising edge of the first through n-th output signals OS2_1, OS2_2, OSnch2_n, respectively, and output the latched signals as first through n-th bit data LDC[1], LDC[2], pecLDC[n], respectively.

The low digital code LDC output by the second coarse time-to-digital converter 114 may include the first through n-th bit data LDC[1], LDC[2], cluLDC[n]. For example, the first bit data LDC[1], which is output by the first flip-flop 119-1, may correspond to a first bit of the low digital code LDC, the second bit data LDC[2], which is output by the second flip-flop 119-2, may correspond to a second bit of the low digital code LDC, and the n-th bit data LDC[n], which is output by the n-th flip-flop 119-n, may correspond to an n-th bit of the low digital code LDC.

Figure 6:
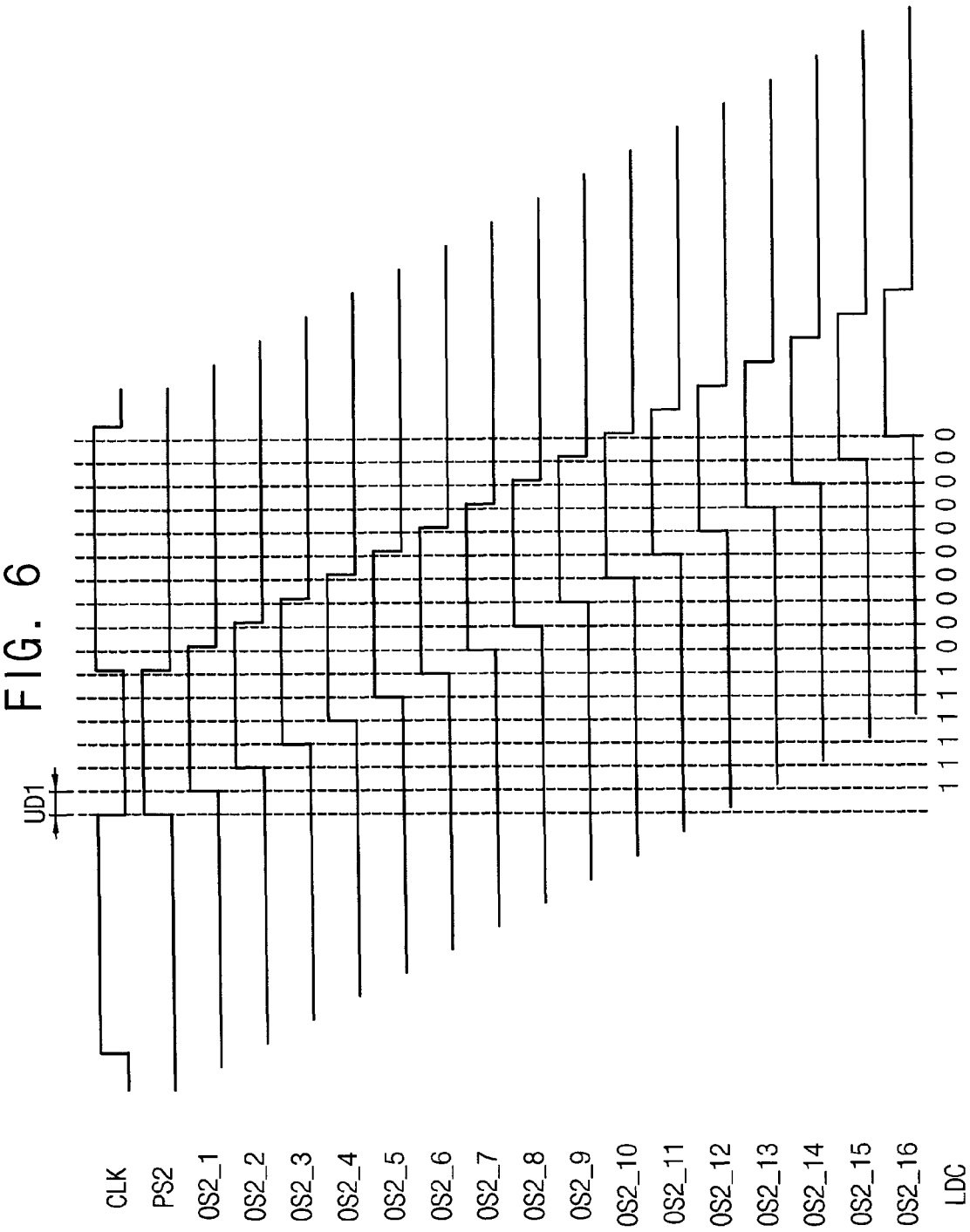
FIG. 6 is a diagram for describing an operation of the second coarse time-to-digital converter of FIG. 5.

FIG. 6 is a diagram for describing an operation of the second coarse time-to-digital converter of FIG. 5.

In FIG. 6, an operation of the second coarse time-to-digital converter 114 in the case that n is 16 is illustrated as an example.

As illustrated in FIG. 6, since the second pulse signal PS2, which has a length corresponding to the length of the low level period of the clock signal CLK, is provided as the input signal of the first delay circuit 118-1, the first through n-th delay circuits 118-1, 118-2, 11e f8-n may generate the first through n-th output signals OS2_1, OS2_2, OS ge2_n, respectively, by consecutively delaying the second pulse signal PS2 for the first unit delay UD1.

As described above, the first through n-th flip-flops 119-1, 119-2, 11cri9-n may latch the second pulse signal PS2 in synchronization with a rising edge of the first through n-th output signals OS2_1, OS2_2, OSnch2_n, respectively, and output the latched signals as first through n-th bit data LDC[1], LDC[2], pecLDC[n], respectively.

Therefore, referring to FIG. 6, since the second pulse signal PS2 is in a logic high level at a rising edge of each of the first through sixth output signals OS2_1, OS2_2, OSput2_6, the first through sixth bit data LDC[1], LDC[2], datLDC[6], which are output by the first through sixth flip-flops 119-1, 119-2, 11p-f9-6, respectively, may have a logic high level. On the other hand, since the second pulse signal PS2 is in a logic low level at a rising edge of each of the seventh through sixteenth output signals OS2_7, O_8, OS th2_16, the seventh through sixteenth bit data LDC[7], LDC[8], h tLDC[16], which are output by the seventh through sixteenth flip-flops 119-7, 119-8, 11 th9-16, respectively, may have a logic low level.

Therefore, the second coarse time-to-digital converter 114 may output-to-dig0000000000utput-tolow digital code LDC. As such, the number of erter 11low level.aclow digital code LDC may be proportional to the length of the second pulse signal PS2.

Although a structure and an operation of the second coarse time-to-digital converter 114 are described above with reference to FIGS. 5 and 6, example embodiments are not limited thereto. The second coarse time-to-digital converter 114 may be implemented with any structures that are able to convert the length of the second pulse signal PS2 into a digital value.

Referring again to FIG. 2, the coarse controller 115 may receive the high digital code HDC from the first coarse time-to-digital converter 112 and receive the low digital code LDC from the second coarse time-to-digital converter 114. The coarse controller 115 may determine the longer period and the shorter period between the high level period of the clock signal CLK and the low level period of the clock signal CLK based on the high digital code HDC and the low digital code LDC. For example, the coarse controller 115 may determine the longer period as the high level period of the clock signal CLK and determine the shorter period as the low level period of the clock signal CLK when the number of tal code LDC from the sh digital code HDC is greater than the number of "1" included in the low digital code LDC. On the other hand, the coarse controller 115 may determine the longer period as the low level period of the clock signal CLK and determine the shorter period as the high level period of the clock signal CLK when the number of "1" included in the low digital code LDC is greater than the number of "1" included in the high digital code HDC.

After that, the coarse controller 115 may output the sign signal SS having a logic level corresponding to the longer period of the clock signal CLK, and output one of the high digital code HDC and the low digital code LDC, which corresponds to the shorter period of the clock signal CLK, as the first digital code DC1.

Figure 7:
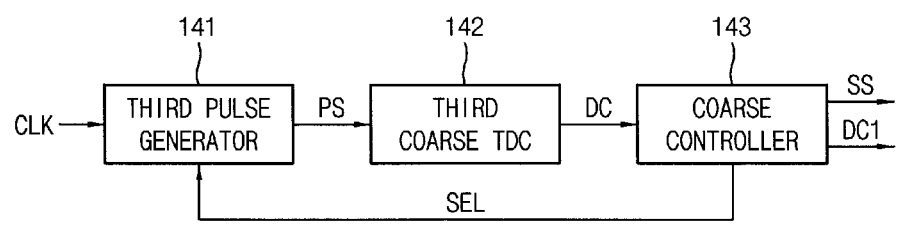
FIG. 7 is a block diagram illustrating an example of a first digital code generator included in the duty cycle error detection device of FIG. 1.

FIG. 7 is a block diagram illustrating an example of a first digital code generator included in the duty cycle error detection device of FIG. 1.

Referring to FIG. 7, a first digital code generator 110b may include a third pulse generator 141, a third coarse time-to-digital converter 142 and a coarse controller 143.

The third pulse generator 141 may receive the clock signal CLK. The third pulse generator 141 may generate a pulse signal PS having a length corresponding to the length of the high level period of the clock signal CLK when a selection signal SEL has a first logic level. The third pulse generator 141 may generate a pulse signal PS having a length corresponding to the length of the low level period of the clock signal CLK when the selection signal SEL has a second logic level.

The third coarse time-to-digital converter 142 may generate a digital code DC by performing the time-to-digital conversion on the length of the pulse signal PS based on the first unit delay UD1. In some example embodiments, the third coarse time-to-digital converter 142 may have the same structure as the first coarse time-to-digital converter 112 of FIG. 3 or the second coarse time-to-digital converter 114 of FIG. 5.

The coarse controller 143 may receive the digital code DC from the third coarse time-to-digital converter 142 as the high digital code HDC while outputting the selection signal SEL having the first logic level, and receive the digital code DC from the third coarse time-to-digital converter 142 as the low digital code LDC while outputting the selection signal SEL having the second logic level.

The coarse controller 143 may determine the longer period and the shorter period between the high level period of the clock signal CLK and the low level period of the clock signal CLK based on the high digital code HDC and the low digital code LDC. For example, the coarse controller 143 may determine the longer period as the high level period of the clock signal CLK and determine the shorter period as the low level period of the clock signal CLK when the number of 3 may determine the longer period and the shorter per than the number of "1" included in the low digital code LDC. On the other hand, the coarse controller 143 may determine the longer period as the low level period of the clock signal CLK and determine the shorter period as the high level period of the clock signal CLK when the number of "1" included in the low digital code LDC is greater than the number of "1" included in the high digital code HDC.

After that, the coarse controller 143 may output the sign signal SS having a logic level corresponding to the longer period of the clock signal CLK, and output one of the high digital code HDC and the low digital code LDC, which corresponds to the shorter period of the clock signal CLK, as the first digital code DC1.

Figure 8:
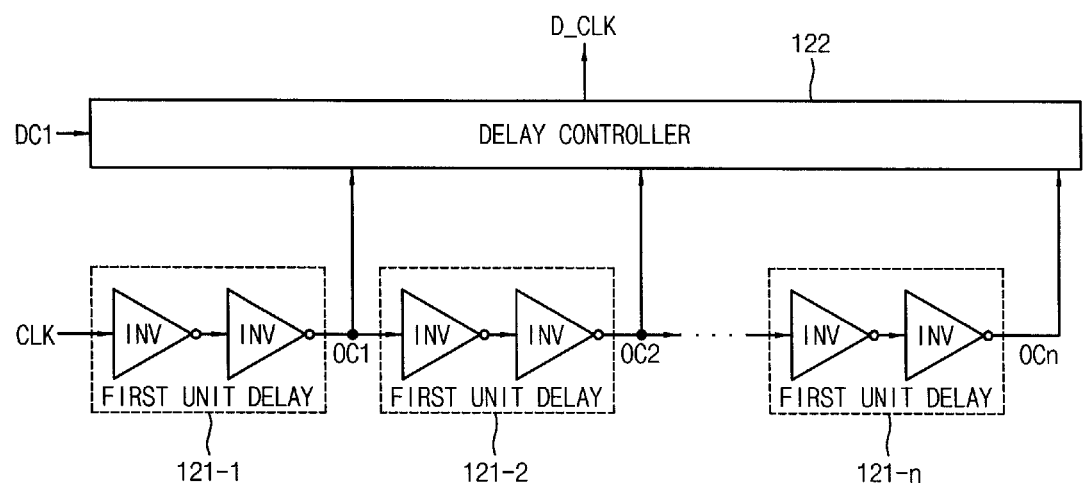
FIG. 8 is a block diagram illustrating an example of a clock delay circuit included in the duty cycle error detection device of FIG. 1.

FIG. 8 is a block diagram illustrating an example of a clock delay circuit included in the duty cycle error detection device of FIG. 1.

Referring to FIG. 8, the clock delay circuit 120 may include first through n-th delay circuits 121-1, 121-2, fe 121-n and a delay controller 122.

The first through n-th delay circuits 121-1, 121-2, e 121-n may be connected in series. For example, an output clock signal of the k-th delay circuit 121-k may be provided as an input clock signal of the (k+1)-th delay circuit 121-(k+1). The clock signal CLK may be provided as an input clock signal of the first delay circuit 121-1.

Each of the first through n-th delay circuits 121-1, 121-2, 121-n may generate the output clock signal by delaying the input clock signal during the first unit delay UD1. The output clock signals of the first through n-th delay circuits 121-1, 121-2, 11s 21-n may be referred to as first through n-th output clock signals OC1, OC2, OalsCn, respectively.

In some example embodiments, as illustrated in FIG. 8, each of the first through n-th delay circuits 121-1, 121-2, 121-n may include even numbers of inverters.

The delay controller 122 may output one of the first through n-th output clock signals OC1, OC2, as an input clock signal of the (k+1)-th delay circuit 121-(k+1). of the 1, 121-2, roller 122 may output one of the first through n-th output digital code DC1 received from the first digital code generator 110.

For example, when the number of put one of the first through n-th output clock signals OC1, OC2, as an input clock s the x-th output clock signal OCx, which is received from the x-th delay circuit 121-x, as the delay clock signal D_CLK.

Figure 9:
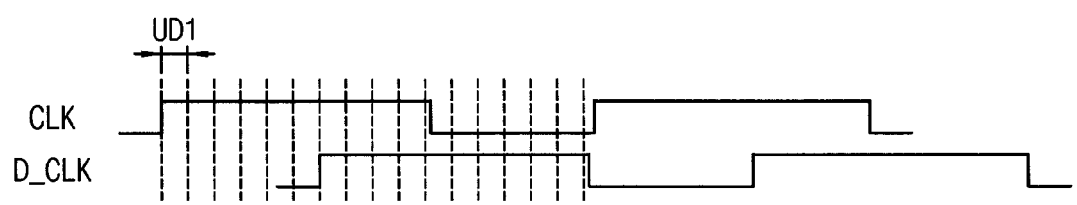
FIGS. 9 and 10 are diagrams for describing an operation of the clock delay circuit of FIG. 8.
Figure 10:
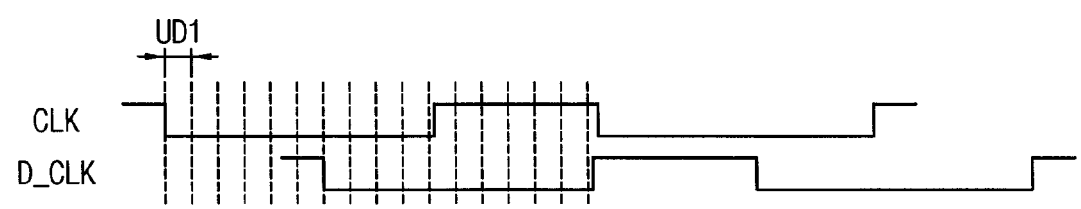

FIGS. 9 and 10 are diagrams for describing an operation of the clock delay circuit of FIG. 8.

The clock signal CLK illustrated in FIG. 9 is the same as the clock signal CLK illustrated in FIGS. 4 and 6.

In this case, the first digital code DC1, which is provided to the clock delay circuit 120 by the first digital code generator 110, may be e1111110000000000 corresponding to the low digital code LDC.

Since the number of code LDCtor 110, may 9 is the same as the clock signal as illustrated in FIG. 9, the delay clock signal D_CLK output from the clock delay circuit 120 may correspond to a delayed version of the clock signal CLK by six times of the first unit delay UD1.

The clock signal CLK illustrated in FIG. 10 is the same as an inverted version of the clock signal CLK illustrated in FIGS. 4 and 6.

In this case, the first digital code DC1, which is provided to the clock delay circuit 120 by the first digital code generator 110, may be "1111110000000000e corresponding to the high digital code HDC.

Since the number of first digital code DC1, which is provided to the clock delay circuit 120 by the first digital code generator 110, may rom the clock delay circuit 120 may correspond to a delayed version of the clock signal CLK by six times of the first unit delay UD1.

Although a structure and an operation of the clock delay circuit 120 are described above with reference to FIGS. 8, 9 and 10, example embodiments are not limited thereto. The clock delay circuit 120 may be implemented with any structures that are able to generate the delay clock signal D_CLK by delaying the clock signal CLK for a time corresponding to the first digital code DC1.

Figure 11:
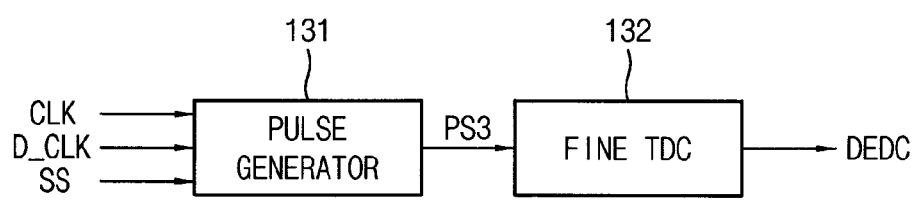
FIG. 11 is a block diagram illustrating an example of a second digital code generator included in the duty cycle error detection device of FIG. 1.

FIG. 11 is a block diagram illustrating an example of a second digital code generator included in the duty cycle error detection device of FIG. 1.

Referring to FIG. 11, the second digital code generator 130 may include a pulse generator 131 and a fine time-to-digital converter 132.

The pulse generator 131 may receive the clock signal CLK, the delay clock signal D_CLK and the sign signal SS. The pulse generator 131 may determine which one corresponds to the longer period between the high level period of the clock signal CLK and the low level period of the clock signal CLK based on the logic level of the sign signal SS received from the first digital code generator 110. The pulse generator 131 may generate a third pulse signal PS3 having a length corresponding to the length from the start of the longer period of the delay clock signal D_CLK to the end of the longer period of the clock signal CLK.

Figure 12:
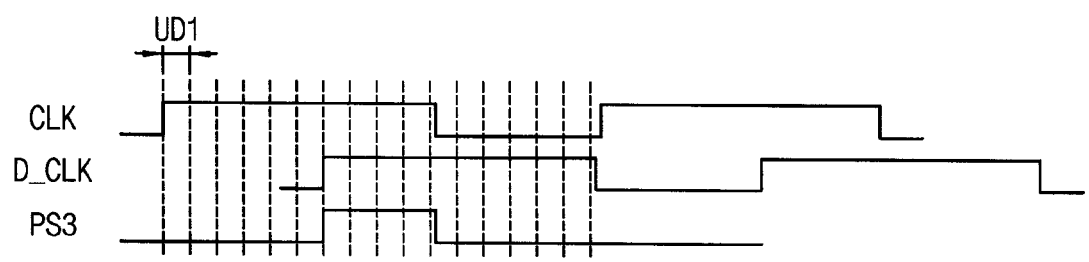
FIGS. 12 and 13 are diagrams for describing an operation of a pulse generator included in the second digital code generator of FIG. 11.
Figure 13:
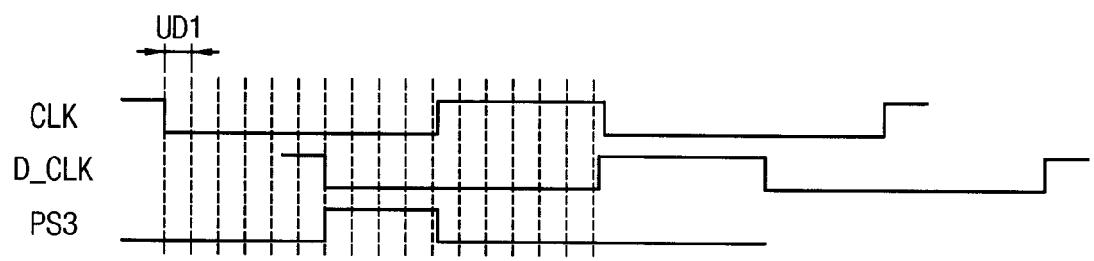

FIGS. 12 and 13 are diagrams for describing an operation of a pulse generator included in the second digital code generator of FIG. 11.

The clock signal CLK and the delay clock signal D_CLK illustrated in FIG. 12 are the same as the clock signal CLK and the delay clock signal D_CLK illustrated in FIG. 9.

In this case, the high level period of the clock signal CLK and the delay clock signal D_CLK may correspond to the longer period. Therefore, as illustrated in FIG. 12, the pulse generator 131 may generate the third pulse signal PS3 having a length corresponding to the length from a start of the high level period of the delay clock signal D_CLK to an end of the high level period of the clock signal CLK.

The clock signal CLK and the delay clock signal D_CLK illustrated in FIG. 13 are the same as the clock signal CLK and the delay clock signal D_CLK illustrated in FIG. 10.

In this case, the low level period of the clock signal CLK and the delay clock signal D_CLK may correspond to the longer period. Therefore, as illustrated in FIG. 13, the pulse generator 131 may generate the third pulse signal PS3 having a length corresponding to the length from a start of the low level period of the delay clock signal D_CLK to an end of the low level period of the clock signal CLK.

Referring again to FIG. 11, the fine time-to-digital converter 132 may generate the duty error digital code DEDC by performing the time-to-digital conversion on the length of the third pulse signal PS3 based on the second unit delay UD2, which is smaller than the first unit delay UD1.

Figure 14:
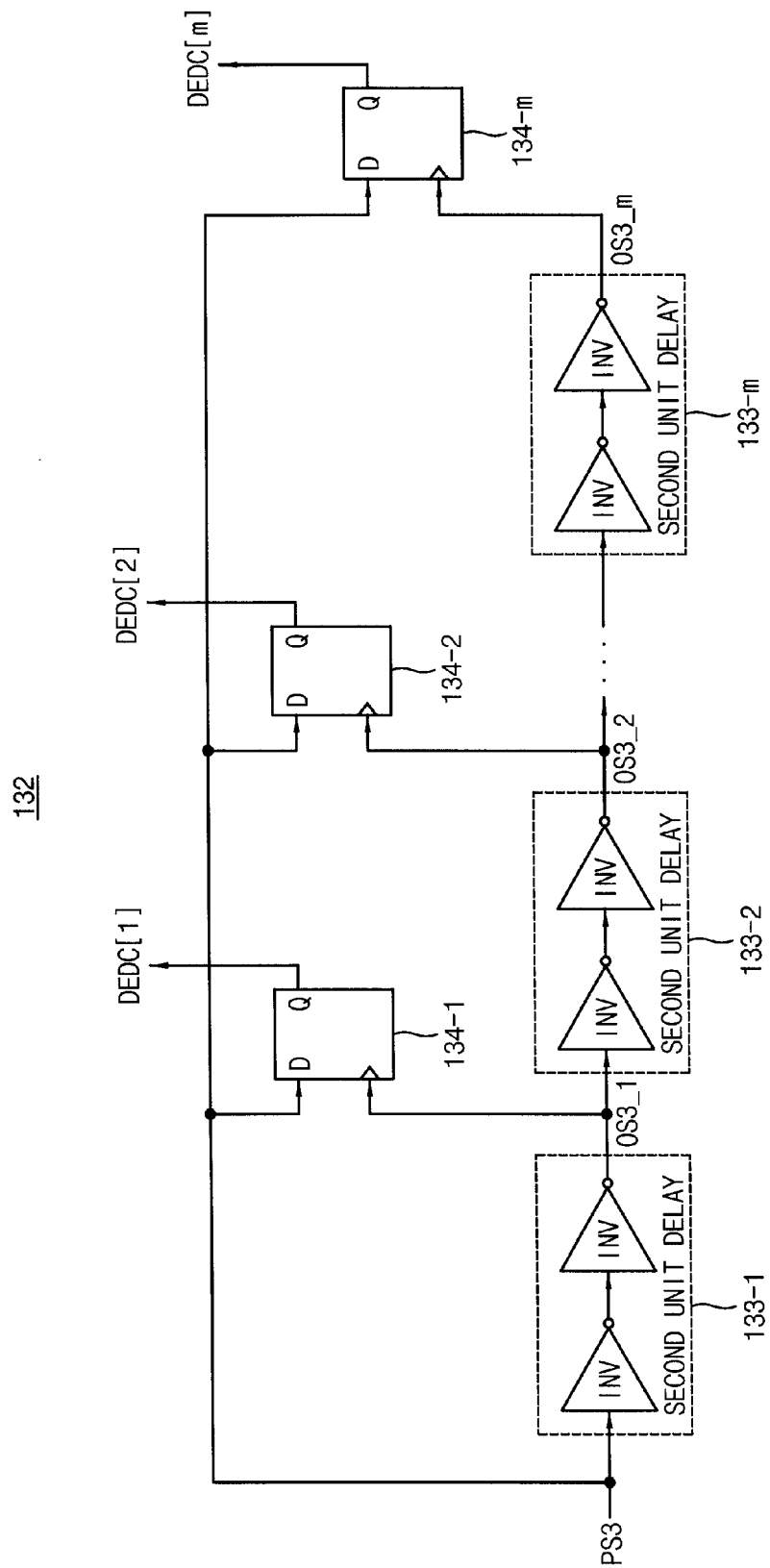
FIG. 14 is a block diagram illustrating an example of a fine time-to-digital converter included in the second digital code generator of FIG. 11.

FIG. 14 is a block diagram illustrating an example of a fine time-to-digital converter included in the second digital code generator of FIG. 11.

Referring to FIG. 14, the fine time-to-digital converter 132 may include first through m-th delay circuits 133-1, 133-2, e generator of Fst through m-th flip-flops 134-1, 134-2, r 132 may include first through m-th delay circuits 133-1, 133-2, e ge The first through m-th delay circuits 133-1, 133-2, e 133-m may be coupled in series. For example, an output signal of the s-th delay circuit 133-s may be provided as an input signal of the (s+1)-th delay circuit 133-(s+1). Here, s represents a positive integer equal to or smaller than (m−1). The third pulse signal PS3 generated by the pulse generator 131 may be provided as an input signal of the first delay circuit 133-1.

Each of the first through m-th delay circuits 133-1, 133-2, ch 133-m may generate the output signal by delaying the input signal for the second unit delay UD2. The output signals of the first through m-th delay circuits 133-1, 133-2, gn 133-m may be referred to as first through m-th output signals OS3_1, OS3_2, cond unit delay UD2.

In some example embodiments, as illustrated in FIG. 14, each of the first through m-th delay circuits 133-1, 133-2, s 133-n may include even numbers of inverters.

The first through m-th flip-flops 134-1, 134-2, FIG. 14, each of the first through m-th delay circuits 133-1, 133-2, s 133-n may include even n delay circuits 133-1, 133-rovided as an input signal of the first delay circuit 133-1.133-1ignals as first through m-th bit data DEDC[1], DEDC[2], . . . , DEDC[m], respectively.

The duty error digital code DEDC output by the fine time-to-digital converter 132 may include the first through m-th bit data DEDC[1], DEDC[2], [2], rst t. For example, the first bit data DEDC[1], which is output by the first flip-flop 134-1, may correspond to a first bit of the duty error digital code DEDC, the second bit data DEDC[2], which is output by the second flip-flop 134-2, may correspond to a second bit of the duty error digital code DEDC, and the m-th bit data DEDC[m], which is output by the m-th flip-flop 134-m, may correspond to an m-th bit of the duty error digital code DEDC.

Figure 15:
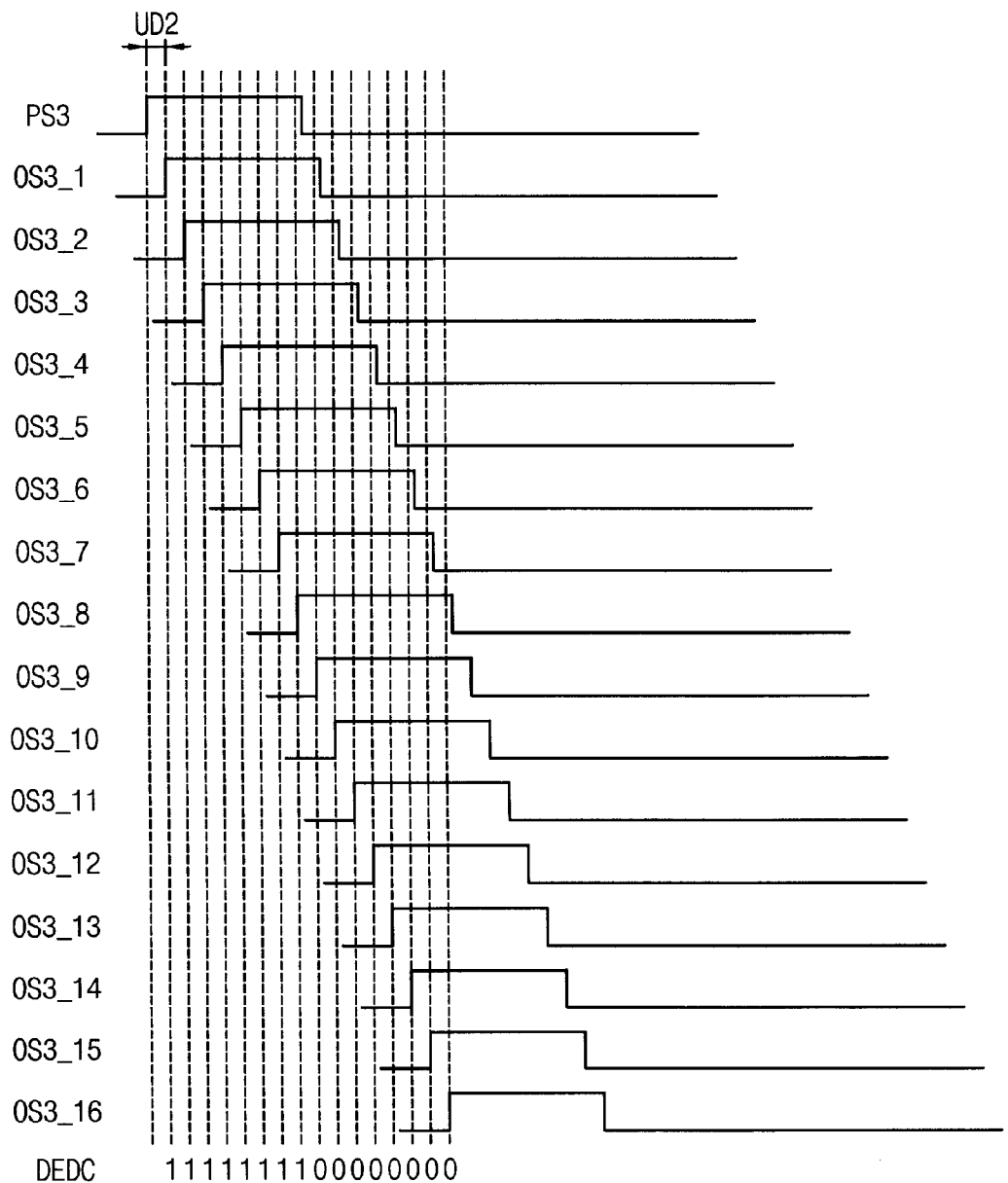
FIG. 15 is a diagram for describing an operation of the fine time-to-digital converter of FIG. 14.

FIG. 15 is a diagram for describing an operation of the fine time-to-digital converter of FIG. 14.

In FIG. 15, an operation of the fine time-to-digital converter 132 in the case that m is 16 is illustrated as an example.

As illustrated in FIG. 15, since the third pulse signal PS3 is provided as the input signal of the first delay circuit 133-1, the first through m-th delay circuits 133-1, 133-2, 1ela33-m may generate the first through m-th output signals OS3_1, OS3_2, OStpu3_m, respectively, by consecutively delaying the third pulse signal PS3 for the second unit delay UD2.

As described above, the first through m-th flip-flops 134-1, 134-2, 1lip34-m may latch the third pulse signal PS3 in synchronization with a rising edge of the first through m-th output signals O_1, OS3_2, OStpu3_m, respectively, and output the latched signals as first through m-th bit data DEDC[1], DEDC[2], daDEDC[m], respectively.

Therefore, referring to FIG. 15, since the third pulse signal PS3 is in a logic high level at a rising edge of each of the first through eighth output signals OS3_1, OS3_2, OS OS3_8, the first through eighth bit data DEDC[1], DEDC[2], datDEDC[8], which are output by the first through eighth flip-flops 134-1, 134-2, lip-34-8, respectively, may have a logic high level. On the other hand, since the third pulse signal PS3 is in a logic low level at a rising edge of each of the ninth through sixteenth output signals OS3_9, OS3_10, OShro3_16, the ninth through sixteenth bit data DEDC[9], DEDC[10], 1thDEDC[16], which are output by the ninth through sixteenth flip-flops 134-9, 134-10, 1 th34-16, respectively, may have a logic low level.

Therefore, the fine time-to-digital converter 132 may output digital conv00000000utput itaduty error digital code DEDC. As such, the number of DCa logic low level.duty error digital code DEDC may be proportional to the length of the third pulse signal PS3.

Although a structure and an operation of the fine time-to-digital converter 132 are described above with reference to FIGS. 14 and 15, example embodiments are not limited thereto. The fine time-to-digital converter 132 may be implemented with any structures that are able to convert the length of the third pulse signal PS3 into a digital value.

As described above with reference to FIGS. 1 to 15, the first digital code generator 110 may generate the high digital code HDC and the low digital code LDC by performing the time-to-digital conversion on the length of the high level period of the clock signal CLK and the length of the low level period of the clock signal CLK, respectively, based on the first unit delay UD1, and the clock delay circuit 120 may generate the delay clock signal D_CLK by delaying the clock signal CLK for a time corresponding to the first digital code DC1, which corresponds to a smaller one between the high digital code HDC and the low digital code LDC. Therefore, the length from the start of the longer period of the delay clock signal D_CLK to the end of the longer period of the clock signal CLK may correspond to a duty cycle error of the clock signal CLK. The second digital code generator 130 may generate the duty error digital code DEDC by performing the time-to-digital conversion on the length from the start of the longer period of the delay clock signal D_CLK to the end of the longer period of the clock signal CLK more precisely based on the second unit delay UD2, which is smaller than the first unit delay UD1. As such, the duty cycle error detection device 100 may generate the duty error digital code DEDC more precisely representing the duty cycle error of the clock signal CLK.

Figure 16:
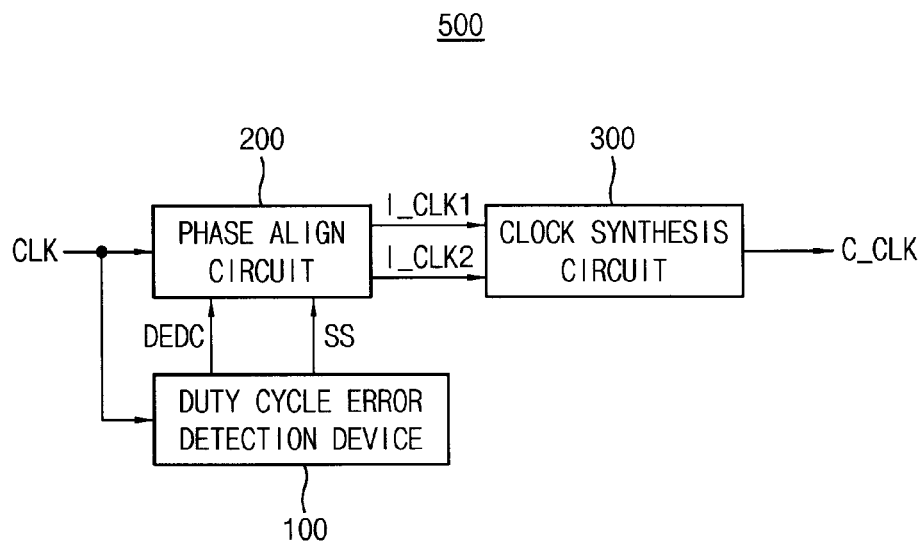
FIG. 16 is a block diagram illustrating a duty cycle correction device according to some example embodiments.

FIG. 16 is a block diagram illustrating a duty cycle correction device according to some example embodiments.

Referring to FIG. 16, a duty cycle correction device 500 includes a duty cycle error detection device 100, a phase align circuit 200 and a clock synthesis circuit 300.

The duty cycle error detection device 100 receives a clock signal CLK, and generates a sign signal SS, which represents a longer period between a high level period of the clock signal CLK and a low level period of the clock signal CLK. In addition, the duty cycle error detection device 100 generates a duty error digital code DEDC, which corresponds to a difference between a length of the high level period of the clock signal CLK and a length of the low level period of the clock signal CLK.

The phase align circuit 200 outputs one of the clock signal CLK and an inverted clock signal, which corresponds to an inverted version of the clock signal CLK, as a first internal clock signal I_CLK1 based on a logic level of the sign signal SS received from the duty cycle error detection device 100, and generates a second internal clock signal I_CLK2 by delaying the other one of the clock signal CLK and the inverted clock signal for a time corresponding to a half of the duty error digital code DEDC received from the duty cycle error detection device 100.

The clock synthesis circuit 300 generates a corrected clock signal C_CLK, which toggles at each rising edge of the first internal clock signal I_CLK1 and each rising edge of the second internal clock signal I_CLK2, based on the first internal clock signal I_CLK1 and the second internal clock signal I_CLK2.

According to the above description related to FIG. 16, the duty cycle error detection device 100 provides the duty error digital code DEDC, which corresponds to a difference between a length of the high level period of the clock signal CLK and a length of the low level period of the clock signal CLK, to the phase align circuit 200, and the phase align circuit 200 generates the second internal clock signal I_CLK2 by delaying the other one of the clock signal CLK and the inverted clock signal for a time corresponding to a half of the duty error digital code DEDC. However, according to example embodiments, the duty cycle error detection device 100 may provide a digital code corresponding to a half of the duty error digital code DEDC to the phase align circuit 200, and the phase align circuit 200 may generate the second internal clock signal I_CLK2 by delaying the other one of the clock signal CLK and the inverted clock signal for a time corresponding to the digital code received from the duty cycle error detection device 100.

Figure 17:
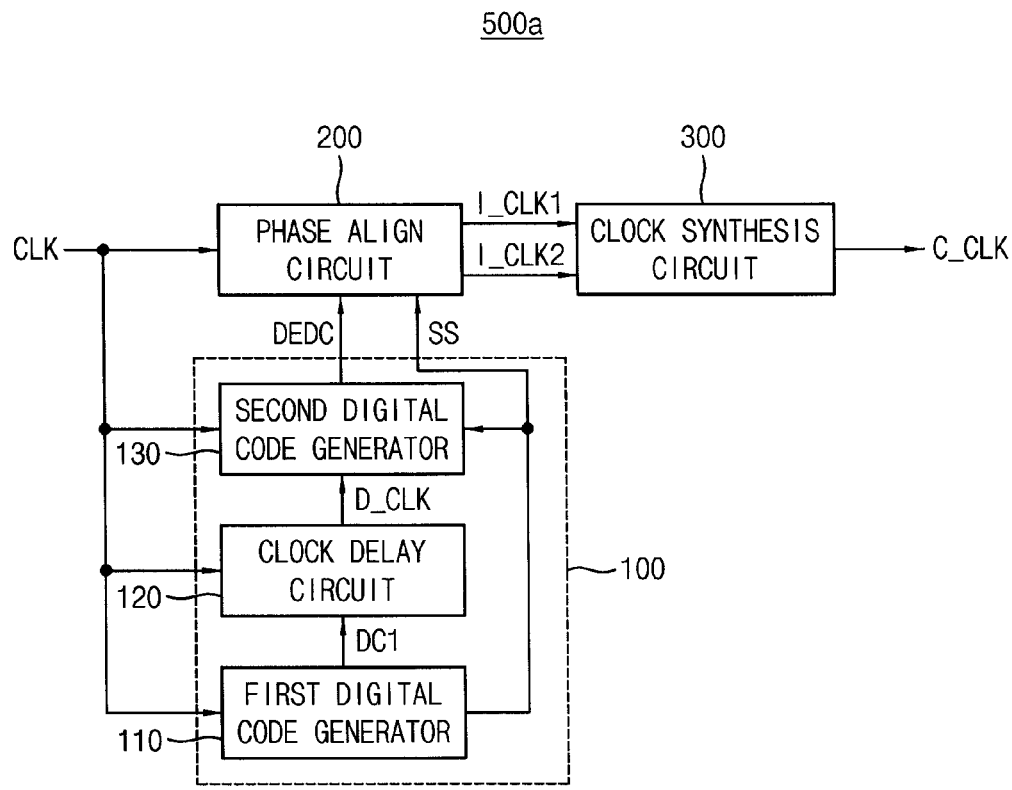
FIG. 17 is a block diagram illustrating an example of the duty cycle correction device of FIG. 16.

FIG. 17 is a block diagram illustrating an example of the duty cycle correction device of FIG. 16.

Referring to FIG. 17, a duty cycle correction device 500a may include the duty cycle error detection device 100, the phase align circuit 200 and the clock synthesis circuit 300.

The duty cycle error detection device 100 included in the duty cycle correction device 500a may include a first digital code generator 110, a clock delay circuit 120 and a second digital code generator 130.

The first digital code generator 110 may receive the clock signal CLK, and generate a high digital code and a low digital code, which correspond to the length of the high level period of the clock signal CLK and the length of the low level period of the clock signal CLK, respectively.

In some example embodiments, the first digital code generator 110 may generate the high digital code by performing a time-to-digital conversion on the length of the high level period of the clock signal CLK based on a first unit delay, and generate the low digital code by performing the time-to-digital conversion on the length of the low level period of the clock signal CLK based on the first unit delay.

The first digital code generator 110 may determine a longer period and a shorter period between the high level period of the clock signal CLK and the low level period of the clock signal CLK based on the high digital code and the low digital code, and generate the sign signal SS representing the longer period of the clock signal CLK.

In addition, the first digital code generator 110 may output one of the high digital code and the low digital code, which corresponds to the shorter period of the clock signal CLK, as a first digital code DC1.

The clock delay circuit 120 may generate a delay clock signal D_CLK by delaying the clock signal CLK for a delay time corresponding to the first digital code DC1 received from the first digital code generator 110.

In some example embodiments, the clock delay circuit 120 may generate the delay clock signal D_CLK by delaying the clock signal CLK for a delay time generated by performing a digital-to-time conversion on the first digital code DC1 based on the first unit delay.

The second digital code generator 130 may determine which one is longer between the high level period of the clock signal CLK and the low level period of the clock signal CLK based on the logic level of the sign signal SS received from the first digital code generator 110. The second digital code generator 130 may generate the duty error digital code DEDC, which corresponds to a length from a start of the longer period of the delay clock signal D_CLK to an end of the longer period of the clock signal CLK.

In some example embodiments, the second digital code generator 130 may generate the duty error digital code DEDC by performing the time-to-digital conversion on the length from the start of the longer period of the delay clock signal D_CLK to the end of the longer period of the clock signal CLK based on a second unit delay, which is smaller than the first unit delay.

In this case, the phase align circuit 200 may generate the second internal clock signal I_CLK2 by delaying the other one of the clock signal CLK and the inverted clock signal for a delay time generated by performing the digital-to-time conversion on the half of the duty error digital code DEDC based on the second unit delay.

In some example embodiments, the duty cycle error detection device 100 included in the duty cycle correction device 500a of FIG. 17 may be implemented with the duty cycle error detection device 100 of FIG. 1.

Figure 18:
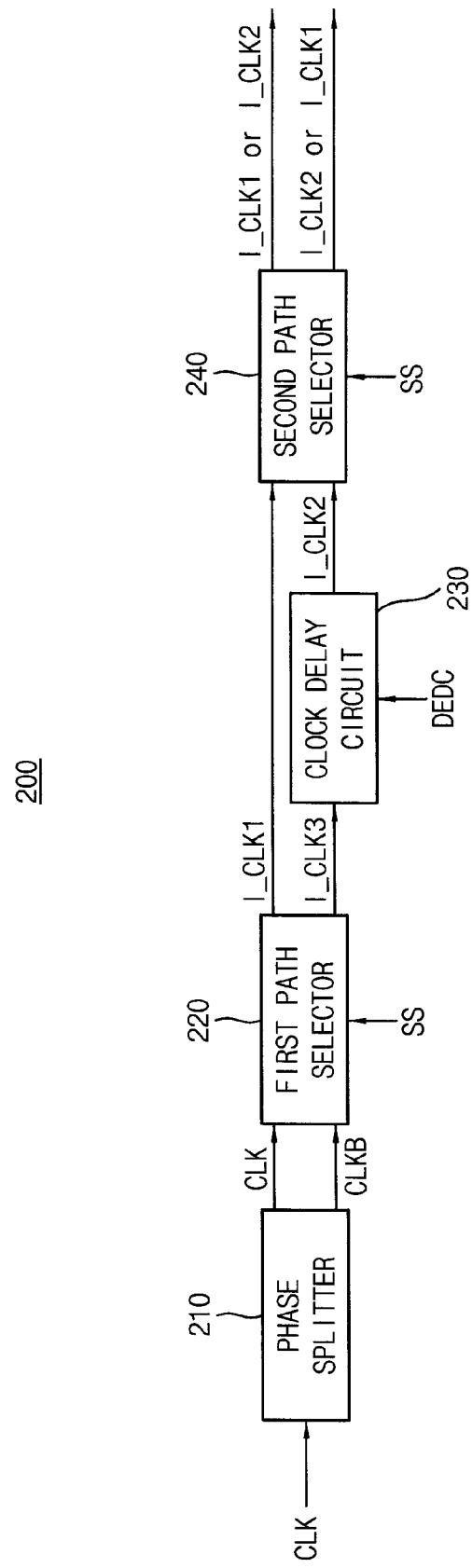
FIG. 18 is a block diagram illustrating an example of a phase align circuit included in the duty cycle correction device of FIG. 16.

FIG. 18 is a block diagram illustrating an example of a phase align circuit included in the duty cycle correction device of FIG. 16.

Referring to FIG. 18, the phase align circuit 200 may include a phase splitter 210, a first path selector 220, a clock delay circuit 230 and a second path selector 240.

The phase splitter 210 may receive the clock signal CLK. The phase splitter 210 may generate the inverted clock signal CLKB by inverting the clock signal CLK, and output the clock signal CLK and the inverted clock signal CLKB in synchronization with each other.

The first path selector 220 may receive the clock signal CLK and the inverted clock signal CLKB from the phase splitter 210. The first path selector 220 may output one of the clock signal CLK and the inverted clock signal CLKB through a first output electrode as the first internal clock signal I_CLK1, and output the other one of the clock signal CLK and the inverted clock signal CLKB through a second output electrode as a third internal clock signal I_CLK3 based on the logic level of the sign signal SS.

As described above, the duty cycle error detection device 100 may generate the sign signal SS having the first logic level when the high level period of the clock signal CLK is longer than the low level period of the clock signal CLK, and may generate the sign signal SS having the second logic level when the low level period of the clock signal CLK is longer than the high level period of the clock signal CLK.

Therefore, when the sign signal SS has the first logic level, the first path selector 220 may determine that the high level period of the clock signal CLK is longer than the low level period of the clock signal CLK. In this case, the first path selector 220 may output the inverted clock signal CLKB through the first output electrode as the first internal clock signal I_CLK1, and output the clock signal CLK through the second output electrode as the third internal clock signal I_CLK3.

On the other hand, when the sign signal SS has the second logic level, the first path selector 220 may determine that the low level period of the clock signal CLK is longer than the high level period of the clock signal CLK. In this case, the first path selector 220 may output the clock signal CLK through the first output electrode as the first internal clock signal I_CLK1, and may output the inverted clock signal CLKB through the second output electrode as the third internal clock signal I_CLK3.

The clock delay circuit 230 may generate the second internal clock signal I_CLK2 by delaying the third internal clock signal I_CLK3 for a time corresponding to a half of the duty error digital code DEDC.

In some example embodiments, the clock delay circuit 230 may generate the second internal clock signal I_CLK2 by delaying the third internal clock signal I_CLK3 during a delay time generated by performing the digital-to-time conversion on the half of the duty error digital code DEDC based on the second unit delay UD2.

Figure 19:
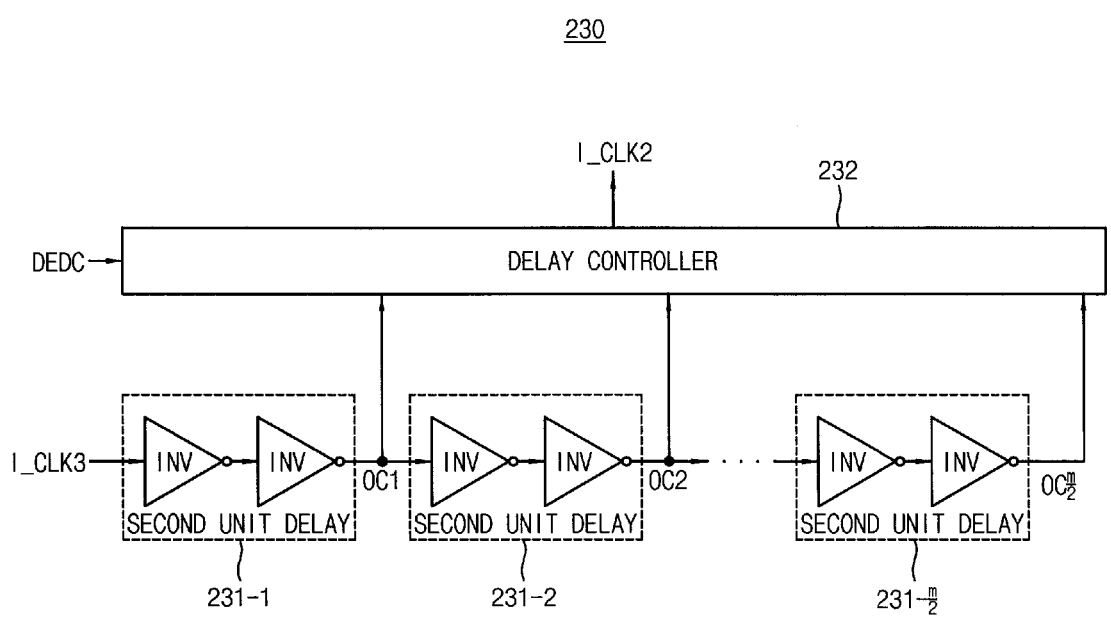
FIG. 19 is a block diagram illustrating an example of a clock delay circuit included in the phase align circuit of FIG. 18.

FIG. 19 is a block diagram illustrating an example of a clock delay circuit included in the phase align circuit of FIG. 18.

Referring to FIG. 19, the clock delay circuit 230 may include first through (m/2)-th delay circuits 231-1, 231-2, fe 231-(m/2) and a delay controller 232.

Since the clock delay circuit 230 generates the second internal clock signal I_CLK2 by delaying the third internal clock signal I_CLK3 for a time corresponding to a half of the duty error digital code DEDC, the number of the first through (m/2)-th delay circuits 231-1, 231-2, . . . , 231-(m/2) included in the clock delay circuit 230 may be a half of the number of the first through m-th delay circuits 133-1, 133-2, ..., 133-m included in the fine time-to-digital converter 132 of the second digital code generator 130, which generates the duty error digital code DEDC.

The first through (m/2)-th delay circuits 231-1, 231-2, e 231-(m/2) may be coupled in series. For example, an output clock signal of the t-th delay circuit 231-t may be provided as an input clock signal of the (t+1)-th delay circuit 231-(t+1). Here, t represents a positive integer equal to or smaller than (m/2−1). The third internal clock signal I_CLK3 may be provided as an input clock signal of the first delay circuit 231-1.

Each of the first through (m/2)-th delay circuits 231-1, 231-2, rs 231-(m/2) may generate the output clock signal by delaying the input clock signal for the second unit delay UD2. The output clock signals of the first through (m/2)-th delay circuits 231-1, 231-2, input clock may be referred to as first through (m/2)-th output clock signals OC1, OC2, s 23(m/2), respectively.

In some example embodiments, as illustrated in FIG. 19, each of the first through (m/2)-th delay circuits 231-1, 231-2, input clock may include even numbers of inverters.

The delay controller 232 may output one of the first through (m/2)-th output clock signals OC1, OC2, input clock, which are received from the first through (m/2)-th delay circuits 231-1, 231-2, input clock, as the second internal clock signal I_CLK2 based on a half of the duty error digital code DEDC.

For example, when the number of code DEDC1, 231-2, duty error digital code DEDC is y, the delay controller 232 may output the (y/2)-th output clock signal OC(y/2), which is received from the (y/2)-th delay circuit 231-(y/2), as the second internal clock signal I_CLK2.

Referring again to FIG. 18, the second path selector 240 may receive the first internal clock signal I_CLK1 from the first path selector 220, and receive the second internal clock signal I_CLK2 from the clock delay circuit 230. The second path selector 240 may output one of the first internal clock signal I_CLK1 and the second internal clock signal I_CLK2 through a first output electrode, and output the other one of the first internal clock signal I_CLK1 and the second internal clock signal I_CLK2 through a second output electrode based on the logic level of the sign signal SS.

As described above, the duty cycle error detection device 100 may generate the sign signal SS having the first logic level when the high level period of the clock signal CLK is longer than the low level period of the clock signal CLK, and generate the sign signal SS having the second logic level when the low level period of the clock signal CLK is longer than the high level period of the clock signal CLK.

Therefore, when the sign signal SS has the first logic level, the second path selector 240 may determine that the high level period of the clock signal CLK is longer than the low level period of the clock signal CLK. In this case, the second path selector 240 may output the second internal clock signal I_CLK2 through the first output electrode, and output first internal clock signal I_CLK1 through the second output electrode.

On the other hand, when the sign signal SS has the second logic level, the second path selector 240 may determine that the low level period of the clock signal CLK is longer than the high level period of the clock signal CLK. In this case, the second path selector 240 may output the first internal clock signal I_CLK1 through the first output electrode, and output the second internal clock signal I_CLK2 through the second output electrode.

Figure 20:
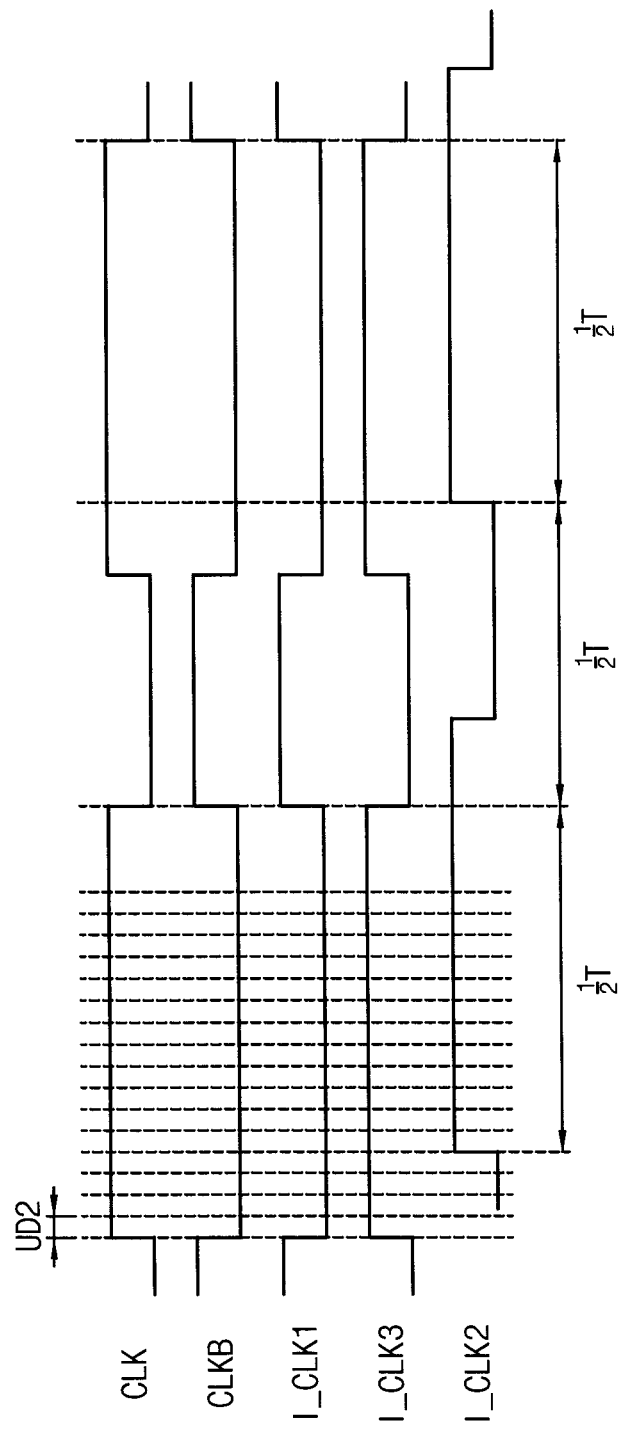
FIGS. 20 and 21 are diagrams for describing an operation of the phase align circuit of FIG. 18.
Figure 21:
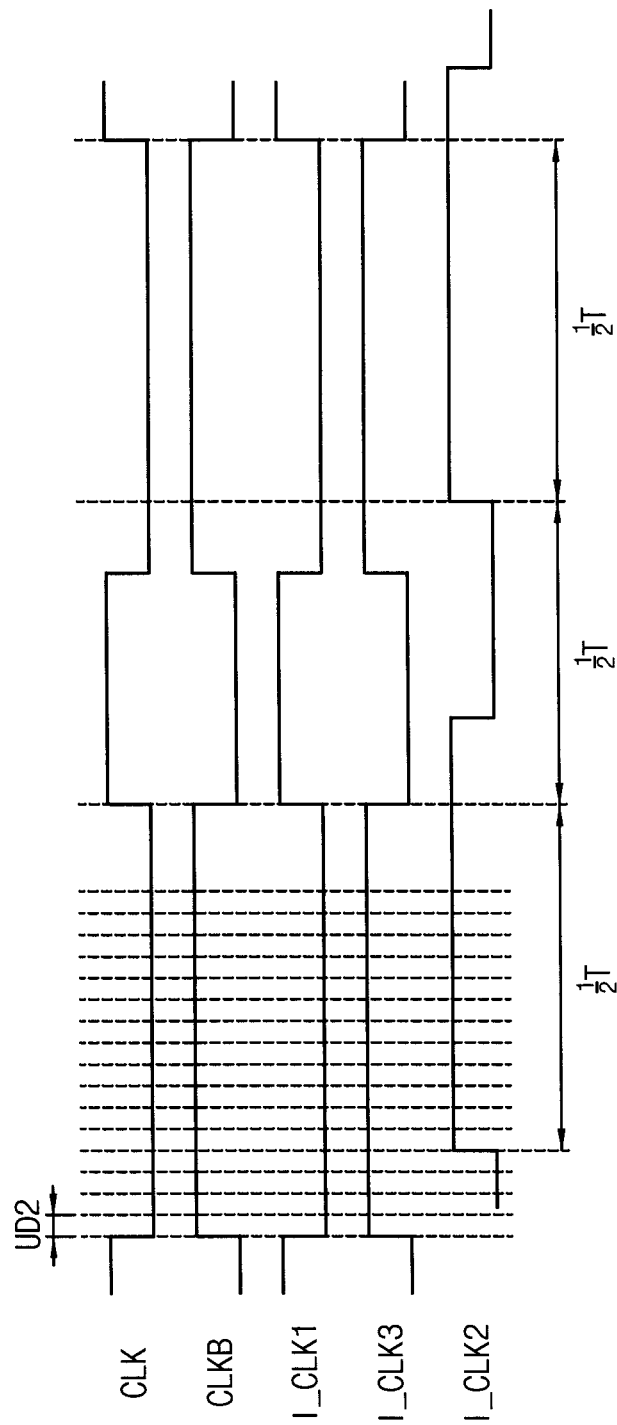

FIGS. 20 and 21 are diagrams for describing an operation of the phase align circuit of FIG. 18.

The clock signal CLK illustrated in FIG. 20 is the same as the clock signal CLK illustrated in FIG. 12.

Therefore, as described above with reference to FIGS. 11 to 15, the duty error digital code DEDC, which is provided to the clock delay circuit 230 by the duty cycle error detection device 100, may be "1111111100000000".

The first path selector 220 may determine that the high level period of the clock signal CLK is longer than the low level period of the clock signal CLK based on the logic level of the sign signal SS. Therefore, as illustrated in FIG. 20, the first path selector 220 may output the inverted clock signal CLKB through the first output electrode as the first internal clock signal I_CLK1, and output the clock signal CLK through the second output electrode as the third internal clock signal I_CLK3.

Since the number of for 220 may determine that the high level period of theht, the number of internal clock signal I_CLK1, and output the clock signal CLK through the second output electrode as the third internal clock signal I_CLK3. FIG. 20, the first from the clock delay circuit 230 may correspond to a delayed version of the third internal clock signal I_CLK3 by four times of the second unit delay UD2.

As illustrated in FIG. 20, a length between a rising edge of the first internal clock signal I_CLK1 and a rising edge of the second internal clock signal I_CLK2 may correspond to a half of a cycle T of the clock signal CLK.

The clock signal CLK illustrated in FIG. 21 is the same as the clock signal CLK illustrated in FIG. 13.

Therefore, as described above with reference to FIGS. 11 to 15, the duty error digital code DEDC, which is provided to the clock delay circuit 230 by the duty cycle error detection device 100, may be "1111111100000000".

The first path selector 220 may determine that the low level period of the clock signal CLK is longer than the high level period of the clock signal CLK based on the logic level of the sign signal SS. Therefore, as illustrated in FIG. 21, the first path selector 220 may output the clock signal CLK through the first output electrode as the first internal clock signal I_CLK1, and output the inverted clock signal CLKB through the second output electrode as the third internal clock signal I_CLK3.

Since the number of utput electrode as the third internal clock signal I_CLK3. the number of "1" included in a half of the duty error digital code DEDC may be four. Therefore, as illustrated in FIG. 21, the second internal clock signal I_CLK2 output from the clock delay circuit 230 may correspond to a delayed version of the third internal clock signal I_CLK3 by four times of the second unit delay UD2.

As illustrated in FIG. 21, a length between a rising edge of the first internal clock signal I_CLK1 and a rising edge of the second internal clock signal I_CLK2 may correspond to a half of a cycle T of the clock signal CLK.

Figure 22:
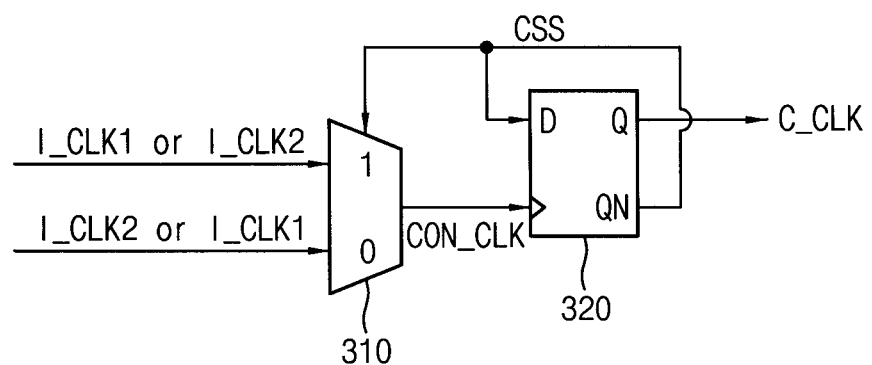
FIG. 22 is a block diagram illustrating an example of a clock synthesis circuit included in the duty cycle correction device of FIG. 16.

FIG. 22 is a block diagram illustrating an example of a clock synthesis circuit included in the duty cycle correction device of FIG. 16.

Referring to FIG. 22, a clock synthesis circuit 300a may include a multiplexer 310 and a flip-flop 320.

The multiplexer 310 may receive the first internal clock signal I_CLK1 and the second internal clock signal I_CLK2 from the first output electrode and the second output electrode of the second path selector 240.

As described above, when the high level period of the clock signal CLK is longer than the low level period of the clock signal CLK, the multiplexer 310 may receive the second internal clock signal I_CLK2 from the first output electrode of the second path selector 240, and receive the first internal clock signal I_CLK1 from the second output electrode of the second path selector 240. On the other hand, when the low level period of the clock signal CLK is longer than the high level period of the clock signal CLK, the multiplexer 310 may receive the first internal clock signal I_CLK1 from the first output electrode of the second path selector 240, and receive the second internal clock signal I_CLK2 from the second output electrode of the second path selector 240.

The multiplexer 310 may output one of the first internal clock signal I_CLK1 and the second internal clock signal I_CLK2 as a control clock signal CON_CLK in response to a clock selection signal CSS, which is provided by the flip-flop 320. For example, the multiplexer 310 may output a clock signal received from the first output electrode of the second path selector 240 as the control clock signal CON_CLK when the clock selection signal CSS has a logic high level, and output a clock signal received from the second output electrode of the second path selector 240 as the control clock signal CON_CLK when the clock selection signal CSS has a logic low level.

The flip-flop 320 may latch the clock selection signal CSS in synchronization with a rising edge of the control clock signal CON_CLK. The flip-flop 320 may output the latched signal as the corrected clock signal C_CLK, and output an inverted version of the corrected clock signal C_CLK as the clock selection signal CSS. Since the clock selection signal CSS toggles at each rising edge of the control clock signal CON_CLK, the multiplexer 310 may alternately output the first internal clock signal I_CLK1 and the second internal clock signal I_CLK2 as the control clock signal CON_CLK at each rising edge of the first internal clock signal I_CLK1 and each rising edge of the second internal clock signal I_CLK2. Therefore, the corrected clock signal C_CLK output from the flip-flop 320 may toggle at each rising edge of the first internal clock signal I_CLK1 and each rising edge of the second internal clock signal I_CLK2.

As described above, the length between a rising edge of the first internal clock signal I_CLK1 and a rising edge of the second internal clock signal I_CLK2 may correspond to a half of a cycle T of the clock signal CLK. Therefore, a cycle of the corrected clock signal C_CLK, which is output from the clock synthesis circuit 300*a*, may be the same as the cycle T of the clock signal CLK while a duty ratio of the corrected clock signal C_CLK is 1:1.

Figure 23:
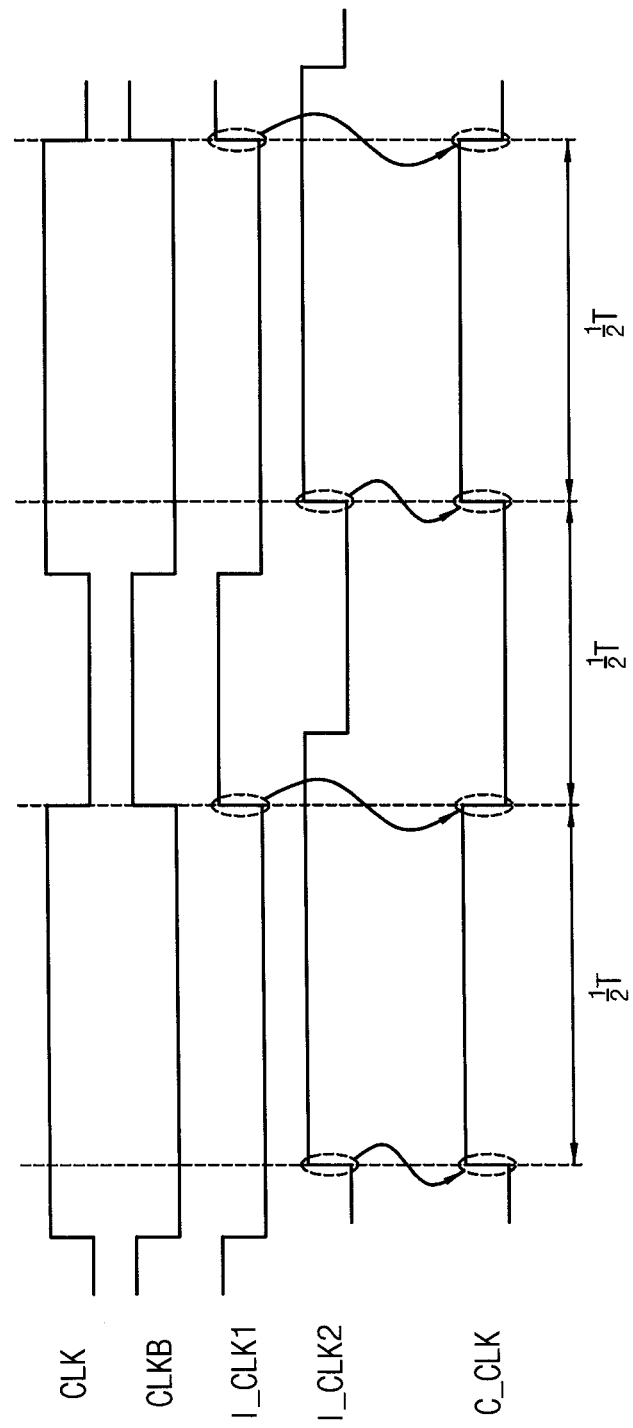
FIGS. 23 and 24 are diagrams for describing an operation of the clock synthesis circuit of FIG. 22.
Figure 24:
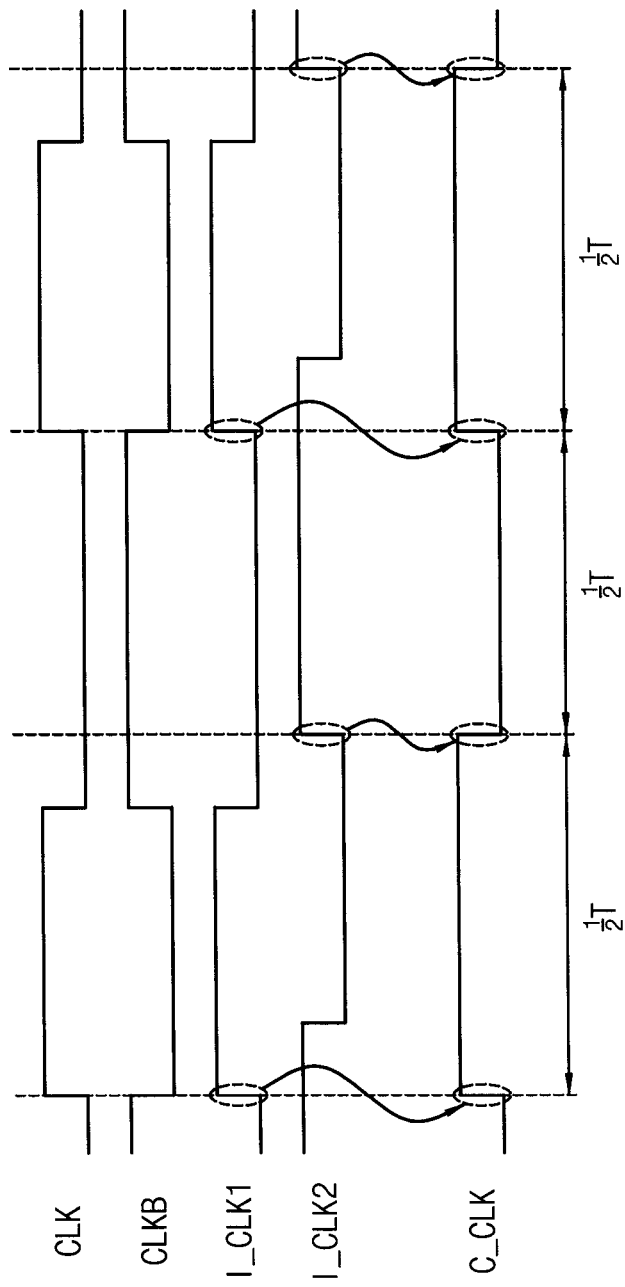

FIGS. 23 and 24 are diagrams for describing an operation of the clock synthesis circuit of FIG. 22.

The clock signal CLK, the inverted clock signal CLKB, the first internal clock signal I_CLK1 and the second internal clock signal I_CLK2 illustrated in FIG. 23 are the same as the clock signal CLK, the inverted clock signal CLKB, the first internal clock signal I_CLK1 and the second internal clock signal I_CLK2 illustrated in FIG. 20.

As described above with reference to FIG. 22, the multiplexer 310 may alternately output the first internal clock signal I_CLK1 and the second internal clock signal I_CLK2 as the control clock signal CON_CLK at each rising edge of the first internal clock signal I_CLK1 and each rising edge of the second internal clock signal I_CLK2, and the flip-flop 320 may output the corrected clock signal C_CLK, which toggles at each rising edge of the control clock signal CON_CLK.

Therefore, as illustrated in FIG. 23, the clock synthesis circuit 300*a* may generate the corrected clock signal C_CLK, which toggles at each rising edge of the first internal clock signal I_CLK1 and each rising edge of the second internal clock signal I_CLK2. As such, as illustrated in FIG. 23, a cycle of the corrected clock signal C_CLK, which is output from the clock synthesis circuit 300*a*, may be the same as the cycle T of the clock signal CLK while a duty ratio of the corrected clock signal C_CLK is 1:1.

The clock signal CLK, the inverted clock signal CLKB, the first internal clock signal I_CLK1 and the second internal clock signal I_CLK2 illustrated in FIG. 24 are the same as the clock signal CLK, the inverted clock signal CLKB, the first internal clock signal I_CLK1 and the second internal clock signal I_CLK2 illustrated in FIG. 21.

As described above with reference to FIG. 22, the multiplexer 310 may alternately output the first internal clock signal I_CLK1 and the second internal clock signal I_CLK2 as the control clock signal CON_CLK at each rising edge of the first internal clock signal I_CLK1 and each rising edge of the second internal clock signal I_CLK2, and the flip-flop 320 may output the corrected clock signal C_CLK, which toggles at each rising edge of the control clock signal CON_CLK.

Therefore, as illustrated in FIG. 24, the clock synthesis circuit 300*a* may generate the corrected clock signal C_CLK, which toggles at each rising edge of the first internal clock signal I_CLK1 and each rising edge of the second internal clock signal I_CLK2. As such, as illustrated in FIG. 24, a cycle of the corrected clock signal C_CLK, which is output from the clock synthesis circuit 300*a*, may be the same as the cycle T of the clock signal CLK while a duty ratio of the corrected clock signal C_CLK is 1:1.

Figure 25:
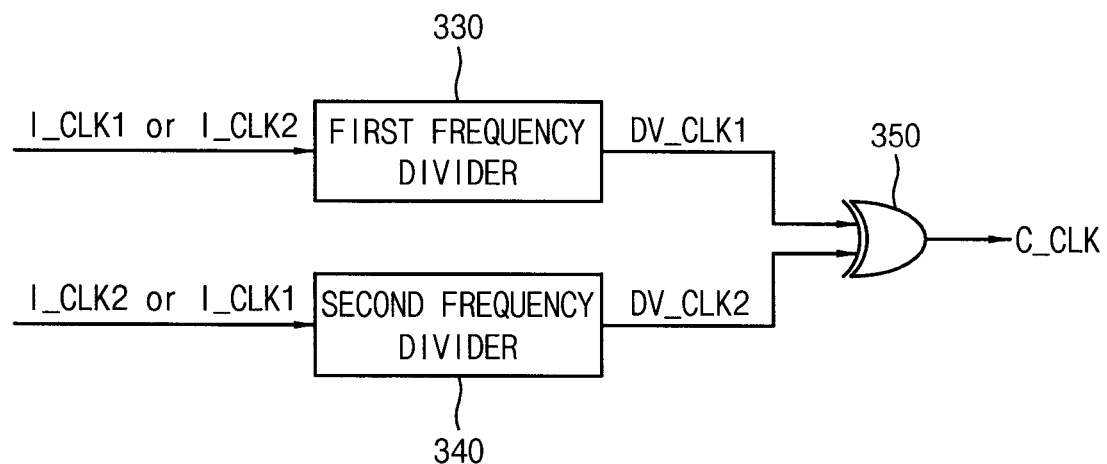
FIG. 25 is a block diagram illustrating an example of a clock synthesis circuit included in the duty cycle correction device of FIG. 16.

FIG. 25 is a block diagram illustrating an example of a clock synthesis circuit included in the duty cycle correction device of FIG. 16.

Referring to FIG. 25, a clock synthesis circuit 300*b* may include a first frequency divider 330, a second frequency divider 340 and an exclusive OR gate 350.

The first frequency divider 330 may generate a first divided clock signal DV_CLK1, which toggles at each rising edge of one of the first internal clock signal I_CLK1 and the second internal clock signal I_CLK2. Therefore, a cycle of the first divided clock signal DV_CLK1 may be two times of the cycle T of the clock signal CLK.

The second frequency divider 340 may generate a second divided clock signal DV_CLK2, which toggles at each rising edge of the other one of the first internal clock signal I_CLK1 and the second internal clock signal I_CLK2. Therefore, a cycle of the second divided clock signal DV_CLK2 may be two times of the cycle T of the clock signal CLK.

Therefore, a phase difference between the first divided clock signal DV_CLK1 and the second divided clock signal DV_CLK2 may be 90 degree.

The exclusive OR gate 350 may perform an exclusive OR (XOR) operation on the first divided clock signal DV_CLK1 and the second divided clock signal DV_CLK2 to generate the corrected clock signal C_CLK.

Figure 26:
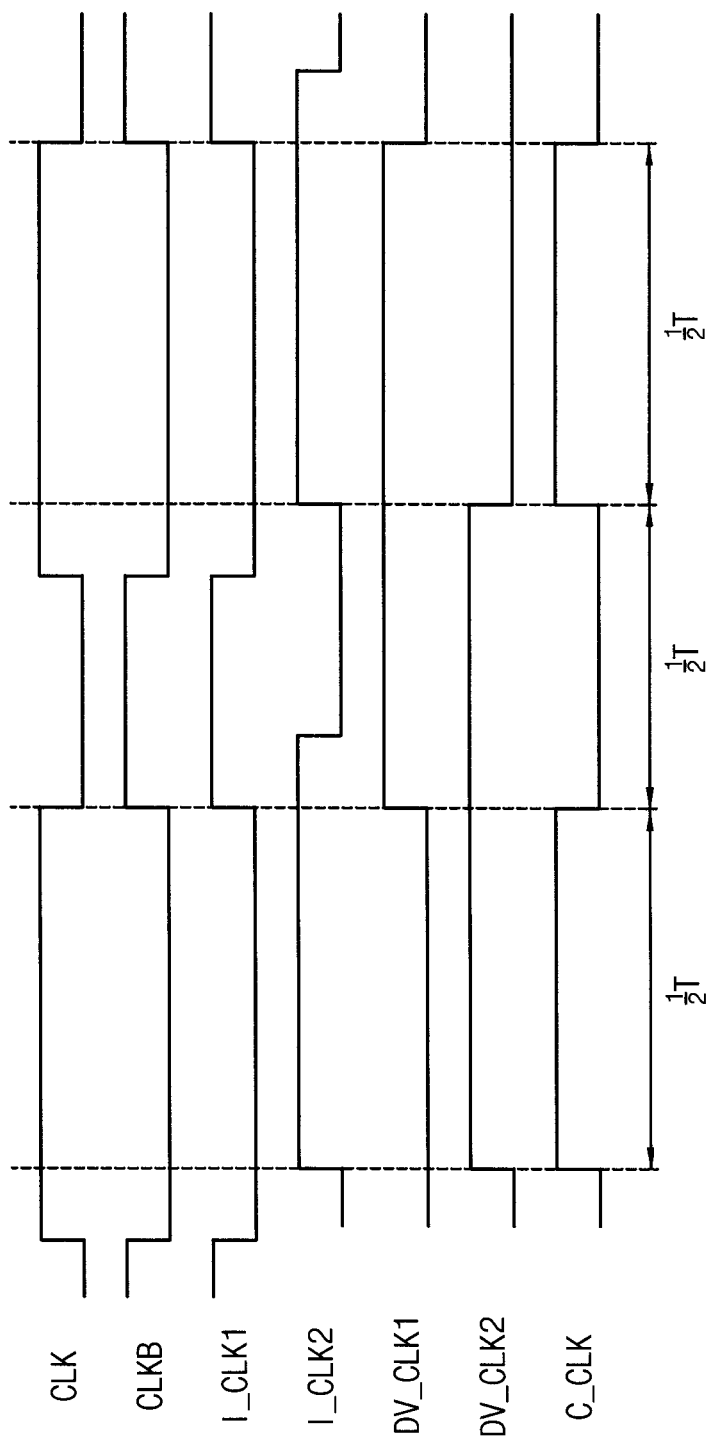
FIGS. 26 and 27 are diagrams for describing an operation of the clock synthesis circuit of FIG. 25.
Figure 27:
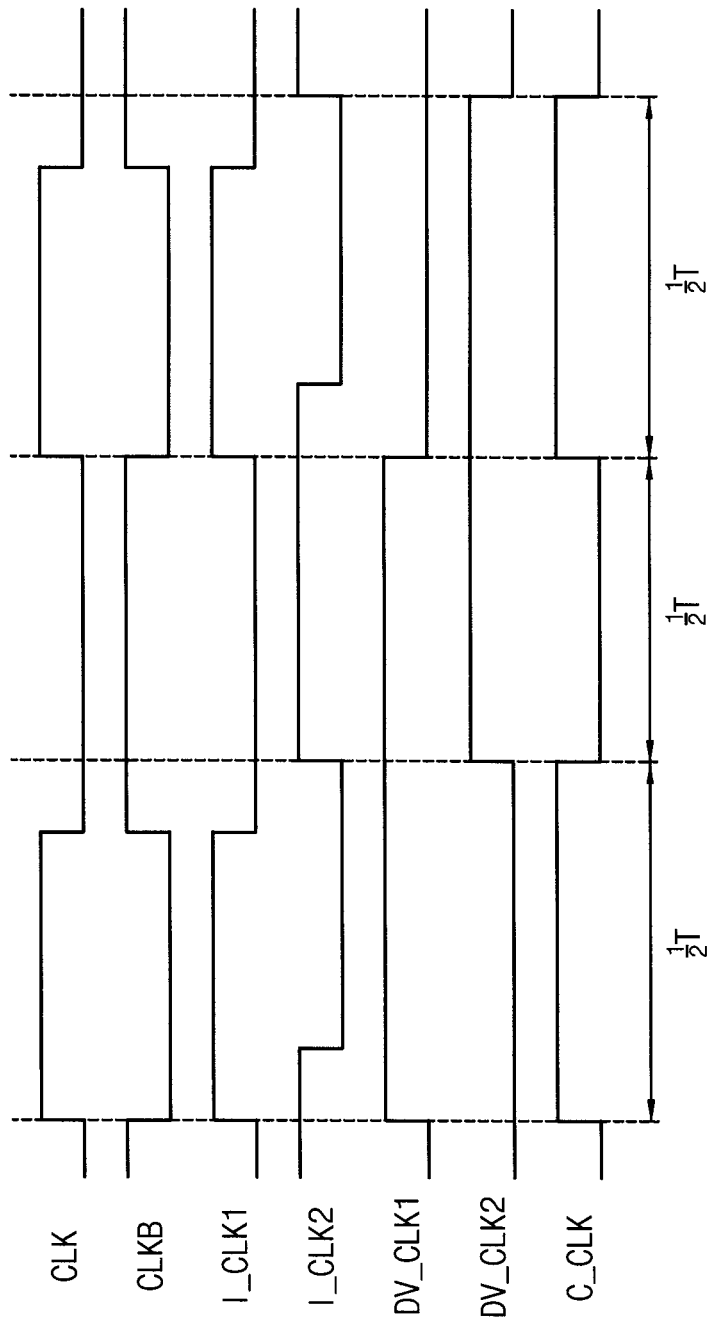

FIGS. 26 and 27 are diagrams for describing an operation of the clock synthesis circuit of FIG. 25.

The clock signal CLK, the inverted clock signal CLKB, the first internal clock signal I_CLK1 and the second internal clock signal I_CLK2 illustrated in FIG. 26 are the same as the clock signal CLK, the inverted clock signal CLKB, the first internal clock signal I_CLK1 and the second internal clock signal I_CLK2 illustrated in FIG. 20.

As described above with reference to FIG. 25, the first frequency divider 330 may generate the first divided clock signal DV_CLK1, which toggles at each rising edge of the first internal clock signal I_CLK1, and the second frequency divider 340 may generate the second divided clock signal DV_CLK2, which toggles at each rising edge of the second internal clock signal I_CLK2. Therefore, as illustrated in FIG. 26, the first divided clock signal DV_CLK1 and the second divided clock signal DV_CLK2 may have a cycle corresponding to two times of the cycle T of the clock signal CLK, while a phase difference between the first divided clock signal DV_CLK1 and the second divided clock signal DV_CLK2 is 90 degree.

Since the exclusive OR gate 350 performs an exclusive OR (XOR) operation on the first divided clock signal DV_CLK1 and the second divided clock signal DV_CLK2 to generate the corrected clock signal C_CLK, as illustrated in FIG. 26, a cycle of the corrected clock signal C_CLK may be the same as the cycle T of the clock signal CLK while a duty ratio of the corrected clock signal C_CLK is 1:1.

The clock signal CLK, the inverted clock signal CLKB, the first internal clock signal I_CLK1 and the second internal clock signal I_CLK2 illustrated in FIG. 27 are the same as the clock signal CLK, the inverted clock signal CLKB, the first internal clock signal I_CLK1 and the second internal clock signal I_CLK2 illustrated in FIG. 21.

As described above with reference to FIG. 25, the first frequency divider 330 may generate the first divided clock signal DV_CLK1, which toggles at each rising edge of the first internal clock signal I_CLK1, and the second frequency divider 340 may generate the second divided clock signal DV_CLK2, which toggles at each rising edge of the second internal clock signal I_CLK2. Therefore, as illustrated in FIG. 27, the first divided clock signal DV_CLK1 and the second divided clock signal DV_CLK2 may have a cycle corresponding to two times of the cycle T of the clock signal CLK, while a phase difference between the first divided clock signal DV_CLK1 and the second divided clock signal DV_CLK2 is 90 degree.

Since the exclusive OR gate 350 performs an exclusive OR (XOR) operation on the first divided clock signal DV_CLK1 and the second divided clock signal DV_CLK2 to generate the corrected clock signal C_CLK, as illustrated in FIG. 27, a cycle of the corrected clock signal C_CLK may be the same as the cycle T of the clock signal CLK while a duty ratio of the corrected clock signal C_CLK is 1:1.

As described above with reference to FIGS. 1 to 27, the duty cycle error detection device 100 may generate the sign signal SS, which represents the longer period between the high level period of the clock signal CLK and the low level period of the clock signal CLK, and generate the duty error digital code DEDC, which corresponds to a difference between the length of the high level period of the clock signal CLK and the length of the low level period of the clock signal CLK, the phase align circuit 200 may output one of the clock signal CLK and the inverted clock signal CLKB as the first internal clock signal I_CLK1 based on the logic level of the sign signal SS, and generate the second internal clock signal I_CLK2 by delaying the other one of the clock signal CLK and the inverted clock signal CLKB for a time corresponding to a half of the duty error digital code DEDC, and the clock synthesis circuit 300 may generate the corrected clock signal C_CLK, which toggles at each rising edge of the first internal clock signal I_CLK1 and each rising edge of the second internal clock signal I_CLK2.

Since the phase align circuit 200 generates the second internal clock signal I_CLK2 by delaying the other one of the clock signal CLK and the inverted clock signal CLKB only for a time corresponding to a half of the difference between the length of the high level period of the clock signal CLK and the length of the low level period of the clock signal CLK not for a whole cycle T of the clock signal CLK, the duty cycle correction device 500 according to example embodiments may be manufactured in a small size while increasing a resolution of a duty cycle correction of the clock signal CLK.

Figure 28:
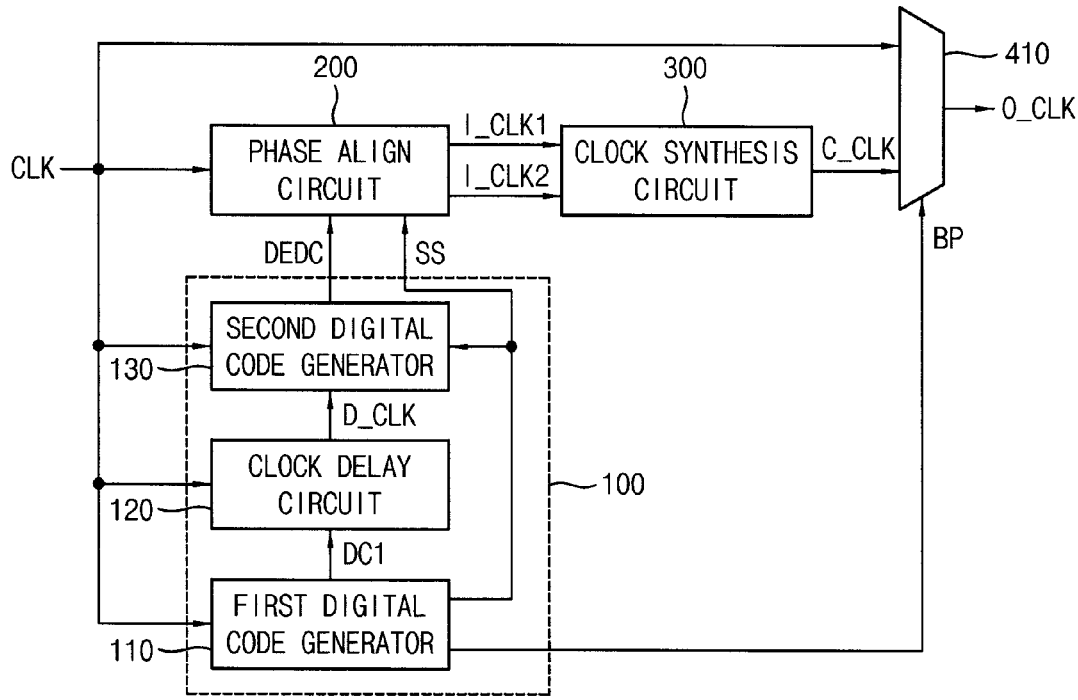
FIG. 28 is a block diagram illustrating an example of the duty cycle correction device of FIG. 16.

FIG. 28 is a block diagram illustrating an example of the duty cycle correction device of FIG. 16.

A duty cycle correction device 500b of FIG. 28 may further include a multiplexer 410 from the duty cycle correction device 500a of FIG. 17.

In this case, the first digital code generator 110 included in the duty cycle error detection device 100 may generate a bypass signal BP based on the high digital code HDC and the low digital code LDC.

For example, when the high digital code HDC is different from the low digital code LDC, the first digital code generator 110 may determine that the clock signal CLK has a duty cycle error, and deactivate the bypass signal BP. On the other hand, when the high digital code HDC is identical to the low digital code LDC, the first digital code generator 110 may determine that the clock signal CLK does not have a duty cycle error, and activate the bypass signal BP.

The multiplexer 410 may receive the clock signal CLK and the corrected clock signal C_CLK. The multiplexer 410 may output the corrected clock signal C_CLK as an output clock signal O_CLK when the bypass signal BP is deactivated, and output the clock signal CLK as the output clock signal O_CLK when the bypass signal BP is activated.

Therefore, the duty cycle correction device 500b may output the corrected clock signal C_CLK as the output clock signal O_CLK when the duty cycle correction device 500b determines that the clock signal CLK has a duty cycle error, and output the clock signal CLK as the output clock signal O_CLK when the duty cycle correction device 500b determines that the clock signal CLK does not have a duty cycle error.

Figure 29:
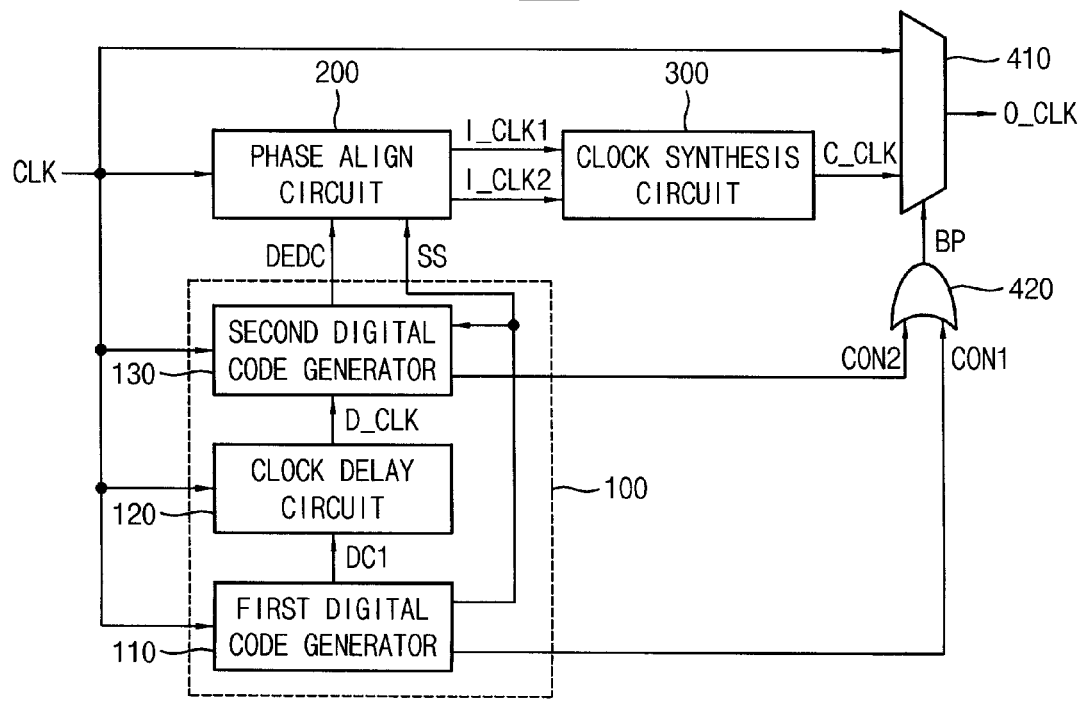
FIG. 29 is a block diagram illustrating an example of the duty cycle correction device of FIG. 16.

FIG. 29 is a block diagram illustrating an example of the duty cycle correction device of FIG. 16.

A duty cycle correction device 500c of FIG. 29 may further include a multiplexer 410 and an OR gate 420 from the duty cycle correction device 500a of FIG. 17.

In this case, the first digital code generator 110 included in the duty cycle error detection device 100 may generate a first control signal CON1 based on the high digital code HDC and the low digital code LDC.

For example, when the high digital code HDC is different from the low digital code LDC, the first digital code generator 110 may determine that the clock signal CLK has a duty cycle error, and deactivate the first control signal CON1. On the other hand, when the high digital code HDC is identical to the low digital code LDC, the first digital code generator 110 may determine that the clock signal CLK does not have a duty cycle error, and activate the first control signal CON1.

The second digital code generator 130 included in the duty cycle error detection device 100 may generate a second control signal CON2 based on the duty error digital code DEDC and a threshold code. The threshold code may be stored in the second digital code generator 130.

For example, when the duty error digital code DEDC is equal to or greater than the threshold code, the second digital code generator 130 may determine that the clock signal CLK has a duty cycle error, and deactivate the second control signal CON2. On the other hand, when the duty error digital code DEDC is smaller than the threshold code, the second digital code generator 130 may determine that the clock signal CLK does not have a duty cycle error, and activate the second control signal CON2.

The OR gate 420 may perform an OR operation on the first control signal CON1 and the second control signal CON2 to generate a bypass signal BP.

The multiplexer 410 may receive the clock signal CLK and the corrected clock signal C_CLK. The multiplexer 410 may output the corrected clock signal C_CLK as an output clock signal O_CLK when the bypass signal BP is deactivated, and output the clock signal CLK as the output clock signal O_CLK when the bypass signal BP is activated.

Therefore, the duty cycle correction device 500c may output the corrected clock signal C_CLK as the output clock signal O_CLK when the duty cycle correction device 500c determines that the clock signal CLK has a duty cycle error, and output the clock signal CLK as the output clock signal O_CLK when the duty cycle correction device 500c determines that the clock signal CLK does not have a duty cycle error.

FIG. 30 is a block diagram illustrating an electronic device according to some example embodiments.

Referring to FIG. 30, an electronic device 600 includes a clock generator 610, a duty cycle correction device 500, a processor 620 and a memory device 630.

The clock generator 610 generates a clock signal CLK used for an operation of the electronic device 600.

The duty cycle correction device 500 generates a corrected clock signal C_CLK by correcting a duty cycle error of the clock signal CLK. The duty cycle correction device 500 included in the electronic device 600 may be implemented with the duty cycle correction device 500 of FIG. 16. A structure and an operation of the duty cycle correction device 500 of FIG. 16 are described above with reference to FIGS. 1 to 29. Therefore, duplicated description will be omitted.

The processor 620 performs various computing functions, such as executing specific software for performing specific calculations or tasks. The processor 620 writes data in the memory device 630 and reads the data from the memory device 630 in synchronization with the corrected clock signal C_CLK. For example, the processor 620 may be a microprocessor or a central process unit. The processor 620 may be connected to the memory device 630 via bus such as an address bus, a control bus, a data bus, etc. According to example embodiments, the processor 620 may be connected to an extended bus, such as peripheral component interconnect (PCI) bus.

The memory device 630 operates in synchronization with the corrected clock signal C_CLK provided by the duty cycle correction device 500. The memory device 630 may store data required for an operation of the electronic device 600. In some example embodiments, the memory device 630 may be a double data rate (DDR) memory device. In this case, the memory device 630 may communicate data with the processor 620 at each rising edge and each falling edge of the corrected clock signal C_CLK. Therefore, if the corrected clock signal C_CLK has a duty cycle error such that a high level period of the corrected clock signal C_CLK is different from a low level period of the corrected clock signal C_CLK, an error may occur in communication between the processor 620 and the memory device 630. However, as described above, the duty cycle correction device 500 generates the corrected clock signal C_CLK by correcting a duty cycle error of the clock signal CLK. Therefore, the electronic device 600 may reduce or prevent an error in the communication between the processor 620 and the memory device 630.

The electronic device 600 may further include a storage device 640, a display device 650, a user interface 660 and an input/output device 670. Although not illustrated in FIG. 30, the electronic device 600 may further include ports to communicate with a video card, a sound card, a memory card, a universal serial bus (USB) device, etc.

The storage device 640 may store data such as multimedia data. The storage device 640 may include a non-volatile memory device such as a flash memory device, a solid state drive (SSD), a hard disk drive (HDD), etc.

The display device 650 may display the multimedia data stored in the storage device 640. The display device 650 may include an organic light emitting diode (OLED) display device, a liquid crystal display (LCD) device, etc.

The user interface 660 may include devices required for a user to control the electronic device 600. The input/output device 670 may include a touch screen, a keypad, a keyboard, a mouse, a speaker, a printer, etc.

The electronic device 600 may be any devices operating based on a clock signal. For example, the electronic device 600 may include a mobile device, a smart phone, a cellular phone, a desktop computer, a laptop computer, a work station, a handheld device, a digital camera, a television, etc.

The foregoing is illustrative of the present inventive concepts and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A duty cycle error detection device, comprising:
    a first digital code generator configured to generate a high digital code and a low digital code, which correspond to a length of a high level period of a clock signal and a length of a low level period of the clock signal, respectively, to determine a longer period and a shorter period between the high level period of the clock signal and the low level period of the clock signal based on the high digital code and the low digital code, to generate a sign signal representing the longer period of the clock signal, and to output one of the high digital code and the low digital code, which corresponds to the shorter period of the clock signal, as a first digital code;
    a clock delay circuit configured to generate a delay clock signal by delaying the clock signal for a time corresponding to the first digital code; and
    a second digital code generator configured to generate a duty error digital code, which corresponds to a length from a start of the longer period of the delay clock signal to an end of the longer period of the clock signal, based on a logic level of the sign signal.

2. The duty cycle error detection device of claim 1, wherein the first digital code generator is configured to generate the high digital code and the low digital code by performing a time-to-digital conversion on the length of the high level period of the clock signal and the length of the low level period of the clock signal, respectively, based on a first unit delay, and the second digital code generator is configured to generate the duty error digital code by performing the time-to-digital conversion on the length from the start of the longer period of the delay clock signal to the end of the longer period of the clock signal based on a second unit delay, which is smaller than the first unit delay.

3. The duty cycle error detection device of claim 2, wherein the clock delay circuit is configured to generate the delay clock signal by delaying the clock signal for a delay time generated by performing a digital-to-time conversion on the first digital code based on the first unit delay.

4. The duty cycle error detection device of claim 2, wherein the first digital code generator includes:
a first pulse generator configured to generate a first pulse signal having a length corresponding to the length of the high level period of the clock signal;
a second pulse generator configured to generate a second pulse signal having a length corresponding to the length of the low level period of the clock signal;
a first coarse time-to-digital converter configured to generate the high digital code by performing the time-to-digital conversion on the length of the first pulse signal based on the first unit delay;
a second coarse time-to-digital converter configured to generate the low digital code by performing the time-to-digital conversion on the length of the second pulse signal based on the first unit delay; and
a coarse controller configured to determine the longer period and the shorter period between the high level period of the clock signal and the low level period of the clock signal based on the high digital code and the low digital code, to output the sign signal having a logic level corresponding to the longer period of the clock signal, and to output one of the high digital code and the low digital code, which corresponds to the shorter period of the clock signal, as the first digital code.

5. The duty cycle error detection device of claim 4, wherein the first coarse time-to-digital converter includes:
first through n-th delay circuits coupled in series, each of the first through n-th delay circuits being configured to generate an output signal by delaying an input signal for the first unit delay, n being an integer equal to or greater than two; and
first through n-th flip-flops configured to latch the first pulse signal in synchronization with a rising edge of the output signal of the first through n-th delay circuits, respectively, and to output the latched signals as first through n-th bit data, respectively,
wherein the input signal of the first delay circuit corresponds to the first pulse signal, and the output signal of the k-th delay circuit is provided as the input signal of the (k+1)-th delay circuit, where k is a positive integer equal to or smaller than (n−1), and
wherein the high digital code includes the first through n-th bit data.

6. The duty cycle error detection device of claim 4, wherein the second coarse time-to-digital converter includes:
first through n-th delay circuits coupled in series, each of the first through n-th delay circuits being configured to generate an output signal by delaying an input signal for the first unit delay, n being an integer equal to or greater than two; and
first through n-th flip-flops configured to latch the second pulse signal in synchronization with a rising edge of the output signal of the first through n-th delay circuits, respectively, and to output the latched signals as first through n-th bit data, respectively,
wherein the input signal of the first delay circuit corresponds to the second pulse signal, and the output signal of the k-th delay circuit is provided as the input signal of the (k+1)-th delay circuit, where k is a positive integer equal to or smaller than (n−1), and
wherein the low digital code includes the first through n-th bit data.

7. The duty cycle error detection device of claim 2, wherein the first digital code generator includes:
a pulse generator configured to generate a pulse signal having a length corresponding to the length of the high level period of the clock signal when a selection signal has a first logic level, and to generate a pulse signal having a length corresponding to the length of the low level period of the clock signal when the selection signal has a second logic level;
a coarse time-to-digital converter configured to generate a digital code by performing the time-to-digital conversion on the length of the pulse signal based on the first unit delay; and
a coarse controller configured to receive the digital code from the coarse time-to-digital converter as the high digital code while outputting the selection signal having the first logic level, and to receive the digital code from the coarse time-to-digital converter as the low digital code while outputting the selection signal having the second logic level, the coarse controller being configured to determine the longer period and the shorter period between the high level period of the clock signal and the low level period of the clock signal based on the high digital code and the low digital code, to output the sign signal having a logic level corresponding to the longer period of the clock signal, and to output one of the high digital code and the low digital code, which corresponds to the shorter period of the clock signal, as the first digital code.

8. The duty cycle error detection device of claim 2, wherein the clock delay circuit includes:
first through n-th delay circuits coupled in series, each of the first through n-th delay circuits being configured to generate an output clock signal by delaying an input clock signal for the first unit delay, n being an integer equal to or greater than two; and
a delay controller configured to output one of the output clock signals received from the first through n-th delay circuits as the delay clock signal based on the first digital code,
wherein the input clock signal of the first delay circuit corresponds to the clock signal, and the output clock signal of the k-th delay circuit is provided as the input clock signal of the (k+1)-th delay circuit, where k is a positive integer equal to or smaller than (n−1).

9. The duty cycle error detection device of claim 2, wherein the second digital code generator includes:
a pulse generator configured to generate a pulse signal having a length corresponding to the length from the start of the longer period of the delay clock signal to the end of the longer period of the clock signal based on the logic level of the sign signal;
first through m-th delay circuits coupled in series, each of the first through m-th delay circuits being configured to generate an output signal by delaying an input signal for the second unit delay, m being an integer equal to or greater than two; and first through m-th flip-flops configured to latch the pulse signal in synchronization with a rising edge of the output signal of the first through m-th delay circuits, respectively, and to output the latched signals as first through m-th bit data, respectively, wherein the input signal of the first delay circuit corresponds to the pulse signal, and the output signal of the s-th delay circuit is provided as the input signal of the (s+1)-th delay circuit, where s is a positive integer equal to or smaller than (m−1), and wherein the duty error digital code includes the first through m-th bit data.

* * * * *